United States Patent
Kang et al.

(10) Patent No.: US 12,381,130 B2
(45) Date of Patent: Aug. 5, 2025

(54) SEMICONDUCTOR PACKAGE

(71) Applicant: Samsung Electronics Co., Ltd., Suwon-si (KR)

(72) Inventors: Gyuho Kang, Cheonan-si (KR); Jongho Park, Cheonan-si (KR); Seong-Hoon Bae, Cheonan-si (KR); Jeonggi Jin, Seoul (KR); Ju-Il Choi, Seongnam-si (KR); Atsushi Fujisaki, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 17/740,508

(22) Filed: May 10, 2022

(65) Prior Publication Data
US 2023/0103196 A1  Mar. 30, 2023

(30) Foreign Application Priority Data
Sep. 17, 2021  (KR) ........................ 10-2021-0124607

(51) Int. Cl.
*H01L 23/48* (2006.01)
*H01L 23/00* (2006.01)
(Continued)

(52) U.S. Cl.
CPC ...... *H01L 23/481* (2013.01); *H01L 23/49816* (2013.01); *H01L 23/49822* (2013.01); *H01L 23/49838* (2013.01); *H01L 23/49894* (2013.01); *H01L 24/08* (2013.01); *H01L 24/16* (2013.01); *H01L 24/32* (2013.01); *H01L 24/73* (2013.01); *H01L 25/105* (2013.01);
(Continued)

(58) Field of Classification Search
CPC ......... H01L 25/105; H01L 2224/08235; H01L 2224/16227; H01L 2224/16237; H01L 2224/16238; H01L 2224/32225; H01L 2224/73204; H01L 23/481; H01L 23/49816; H01L 23/49822; H01L 23/49838; H01L 23/49894; H01L 24/08; H01L 24/16; H01L 24/32; H01L 24/73; H01L 24/10; H01L 24/18; H01L 24/26; H01L 24/34
See application file for complete search history.

(56) References Cited

U.S. PATENT DOCUMENTS 9,449,953 B1  9/2016  Shih et al.
9,768,105 B2  9/2017  Lii et al.
(Continued)

*Primary Examiner* — Galina G Yushina
(74) *Attorney, Agent, or Firm* — Muir Patent Law, PLLC

(57) ABSTRACT

A semiconductor device includes a first redistribution substrate, a semiconductor chip on a top surface of the first redistribution substrate, a conductive structure on the top surface of the first redistribution substrate and laterally spaced apart from the semiconductor chip, and a molding layer on the first redistribution substrate and covering a sidewall of the semiconductor chip and a sidewall of the conductive structure. The conductive structure includes a first conductive structure having a first sidewall, and a second conductive structure on a top surface of the first conductive structure and having a second sidewall. The first conductive structure has an undercut at a lower portion of the first sidewall. The second conductive structure has a protrusion at a lower portion of the second sidewall.

19 Claims, 23 Drawing Sheets

(51) Int. Cl.
*H01L 23/498* (2006.01)
*H01L 25/10* (2006.01)

(52) U.S. Cl.
CPC ............... *H01L 2224/08235* (2013.01); *H01L 2224/16227* (2013.01); *H01L 2224/16237* (2013.01); *H01L 2224/16238* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2225/1094* (2013.01); *H01L 2924/1431* (2013.01); *H01L 2924/1432* (2013.01); *H01L 2924/1433* (2013.01); *H01L 2924/1434* (2013.01); *H01L 2924/182* (2013.01); *H01L 2924/3511* (2013.01)

(56) References Cited

U.S. PATENT DOCUMENTS

| | | | |
|---|---|---|---|
| 10,056,351 B2 | 8/2018 | Yu et al. | |
| 10,256,114 B2 | 4/2019 | Huemoeller et al. | |
| 10,475,770 B2 | 11/2019 | Lee et al. | |
| 2002/0115356 A1* | 8/2002 | Baker | H01L 24/01 29/877 |
| 2006/0105565 A1* | 5/2006 | Liu | C25D 3/38 257/E21.585 |
| 2015/0348912 A1* | 12/2015 | Su | H01L 21/4842 438/123 |
| 2018/0025966 A1* | 1/2018 | Hwang | H01L 21/4846 257/737 |
| 2018/0277394 A1* | 9/2018 | Huemoeller | H01L 23/5389 |
| 2020/0135543 A1 | 4/2020 | Wang et al. | |
| 2020/0328144 A1* | 10/2020 | Fan | H01L 21/56 |
| 2021/0090973 A1 | 3/2021 | Lee et al. | |
| 2021/0225722 A1* | 7/2021 | Kuo | H01L 25/105 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0124607 filed on Sep. 17, 2021, in the Korean Intellectual Property Office, the disclosure of which is hereby incorporated by reference in its entirety.

BACKGROUND

The present inventive concepts relate to a semiconductor package, and more particularly, to a semiconductor package including a redistribution substrate and a method of fabricating the same.

A semiconductor package is provided to implement an integrated circuit chip to qualify for use in electronic products. A semiconductor package is typically configured such that a semiconductor chip is mounted on a printed circuit board, and bonding wires or bumps are used to electrically connect the semiconductor chip to the printed circuit board. With the development of electronic industry, various research activities have been conducted to improve reliability and durability of semiconductor packages.

SUMMARY

Some embodiments of the present inventive concepts provide semiconductor package with improved electrical and thermal properties.

Some embodiments of the present inventive concepts provide a semiconductor package fabrication method with improved efficiency and simplification.

According to some embodiments of the present inventive concepts, a semiconductor package may comprise: a first redistribution substrate; a semiconductor chip on a top surface of the first redistribution substrate; a conductive structure provided on the top surface of the first redistribution substrate and laterally spaced apart from the semiconductor chip; and a molding layer on the first redistribution substrate, the molding layer covering a sidewall of the semiconductor chip and a sidewall of the conductive structure. The conductive structure may include: a first conductive structure having a first sidewall; and a second conductive structure on a top surface of the first conductive structure, the second conductive structure having a second sidewall. The first conductive structure may have an undercut at a lower portion of the first sidewall. The second conductive structure may have a protrusion at a lower portion of the second sidewall.

According to some embodiments of the present inventive concepts, a semiconductor package may comprise: a first redistribution substrate; a semiconductor chip on a top surface of the first redistribution substrate; a conductive structure on the top surface of the first redistribution substrate and laterally spaced apart from the semiconductor chip; and a second redistribution substrate provided on the semiconductor chip and the conductive structure and coupled to the conductive structure. The conductive structure may include: a first conductive structure having a first sidewall and an undercut at a lower portion of the first sidewall; and a second conductive structure on the first conductive structure. A first height of the first conductive structure may be less than a second height of the second conductive structure.

According to some embodiments of the present inventive concepts, a semiconductor package may comprise: a first redistribution substrate that includes a first dielectric layer, a first conductive pattern, and a first redistribution pattern on the first conductive pattern; a solder ball on a bottom surface of the first redistribution substrate; a semiconductor chip on a top surface of the first redistribution substrate; a conductive structure provided on the first redistribution substrate and laterally spaced apart from the semiconductor chip; a second conductive pattern between the first redistribution substrate and the conductive structure; a molding layer provided on the first redistribution substrate and covering the semiconductor chip, the molding layer covering a sidewall of the conductive structure and exposing a top surface of the conductive structure; and a second redistribution substrate provided on the molding layer and electrically connected to the conductive structure. The second redistribution substrate may include a second dielectric layer, a third conductive pattern, and a second redistribution pattern on the third conductive pattern. The first dielectric layer may include a photo-imageable polymer. The second dielectric layer may include a photo-imageable polymer. The conductive structure may include a signal conductive structure and a ground/power structure that are electrically separated from each other. Each of the signal conductive structure and the ground/power structure may include: a first conductive structure that has a first sidewall and an undercut in a lower portion of the first sidewall; and a second conductive structure on a top surface of the first conductive structure. The second conductive structure may have a second sidewall and a protrusion on a lower portion of the second sidewall.

DETAILED DESCRIPTION OF EMBODIMENTS

Figure 1A:
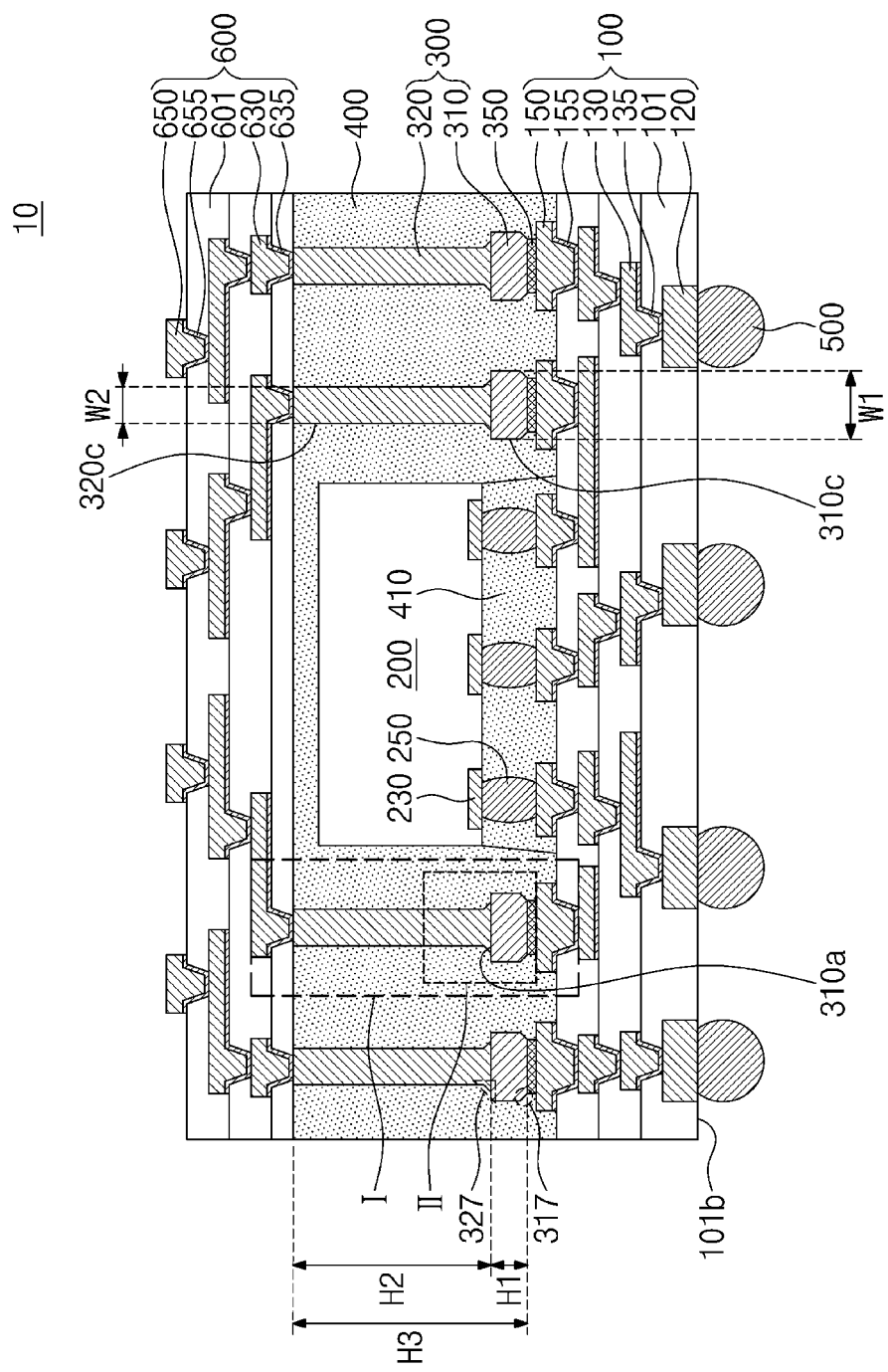
FIG. 1A illustrates a cross-sectional view showing a semiconductor package according to some embodiments.

In this description, like reference numerals may indicate like components. The following will now describe a semiconductor package and its fabrication method according to the present inventive concepts.

Figure 1B:
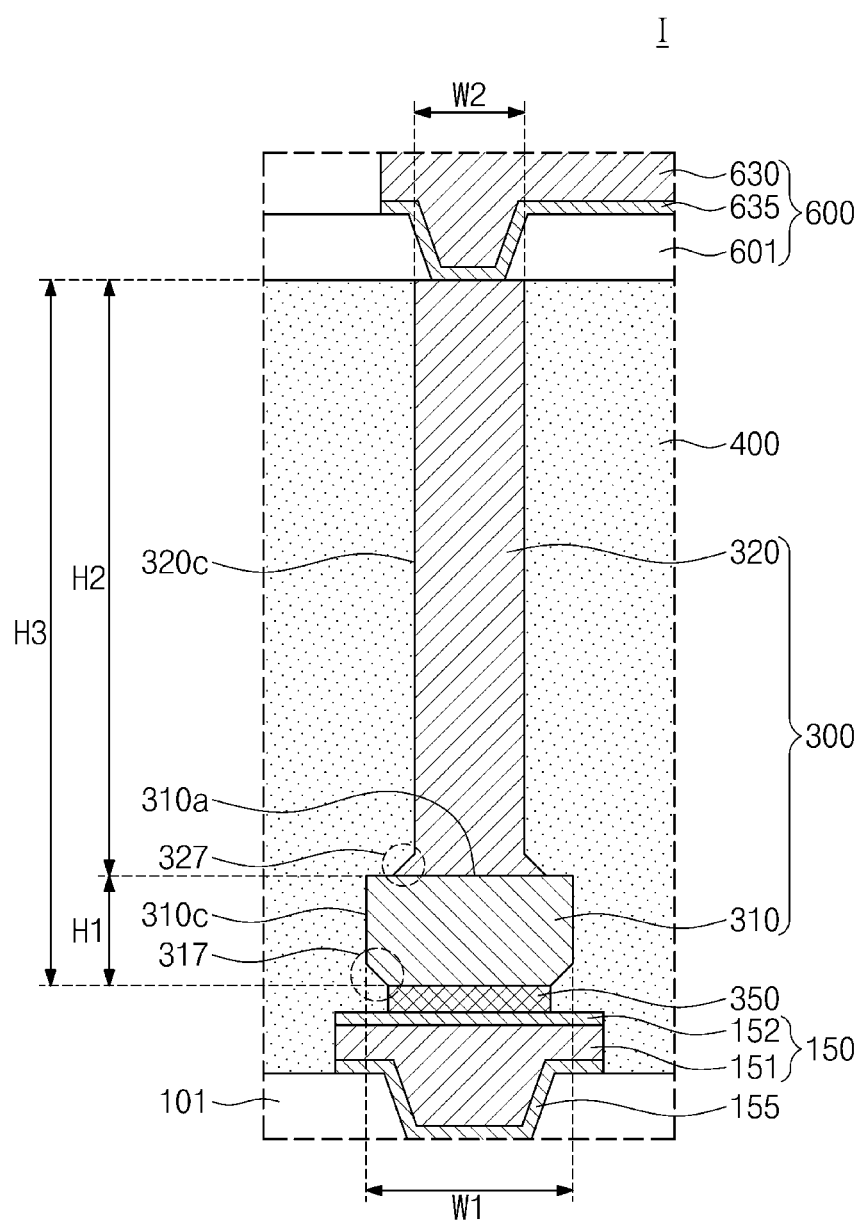
FIG. 1B illustrates an enlarged view showing section I of FIG. 1A.
Figure 1C:
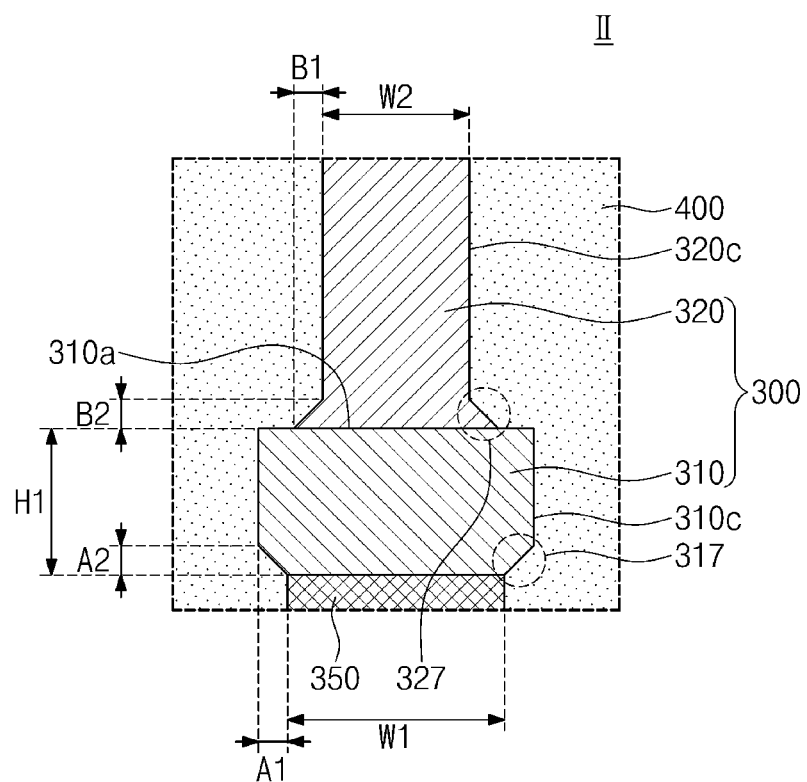
FIG. 1C illustrates an enlarged view showing section II of FIG. 1B.

FIG. 1A illustrates a cross-sectional view showing a semiconductor package according to some embodiments. FIG. 1B illustrates an enlarged view showing section I of FIG. 1A. FIG. 1C illustrates an enlarged view showing section II of FIG. 1B.

Referring to FIGS. 1A to 1C, a semiconductor package 10 may include a first redistribution substrate 100, solder balls 500, a semiconductor chip 200, conductive structures 300, a molding layer 400, and a second redistribution substrate 600. The semiconductor package 10 may be a lower package.

The first redistribution substrate 100 may include a first dielectric layer 101, under-bump patterns 120, first redistribution patterns 130, first seed patterns 135 (i.e., first conductive pattern), first seed pads 155 (i.e., second conductive patterns), and first redistribution pads 150. The first dielectric layer 101 may include or may be formed of an organic material, such as a photo-imageable dielectric (PID). The photo-imageable dielectric may be a polymer. The photo-imageable dielectric may include or may be formed of, for example, at least one selected from photosensitive polyimide, polybenzoxazole, phenolic polymers, and benzocyclobutene polymers. The first dielectric layer 101 may be provided in plural. The number of stacked first dielectric layers 101 may be variously changed. For example, the plurality of first dielectric layers 101 may include or may be formed of the same material as each other. An indistinct interface may be provided between neighboring first dielectric layers 101.

The under-bump patterns 120 may be provided in a lowermost first dielectric layer 101. The under-bump patterns 120 may have their bottom surfaces that are not covered with the lowermost first dielectric layer 101. The under-bump patterns 120 may serve as pads for the solder balls 500. The under-bump patterns 120 may be laterally spaced apart and electrically insulated from each other. The phrase "two components are laterally spaced apart from each other" may mean "two components are horizontally spaced apart from each other." The term "horizontal" may mean "parallel to a bottom surface of the first redistribution substrate 100." The bottom surface of the first redistribution substrate 100 may include a bottom surface 101b of the lowermost first dielectric layer 101 and the bottom surfaces of the under-bump patterns 120. The under-bump patterns 120 may include or may be formed of metal, such as copper.

The first redistribution patterns 130 may be provided on and electrically connected to the under-bump patterns 120. The first redistribution patterns 130 may be laterally spaced apart and electrically separated from each other. The first redistribution patterns 130 may include or may be formed of metal, such as copper. The phrase "electrically connected to the first redistribution substrate 100" may mean that "electrically connected to one of the first redistribution patterns 130." The expression "two components are electrically connected to each other" may mean that "two components are electrically directly connected to each other or indirectly connected to each other through other component(s)." It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

Each of the first redistribution patterns 130 may include a first via part and a first wire part. The first via part may be provided in a corresponding first dielectric layer 101. The first wire part may be provided on the first via part, and the first wire part and the first via part may be connected to each other without an interface therebetween. A width of the first wire part may be greater than a width of the first via part. The first wire part may extend onto a top surface of a corresponding first dielectric layer 101. In this description, the component "via" may be an element for vertical connection, and the component "wire" may be an element for horizontal connection. The term "vertical/perpendicular" may mean "vertical/perpendicular to the bottom surface of the first redistribution substrate 100."

The first redistribution patterns 130 may include a lower redistribution pattern and an upper redistribution pattern that are stacked on each other. The lower redistribution pattern may be disposed on a corresponding under-bump pattern 120. The upper redistribution pattern may be disposed on and coupled to the lower redistribution pattern. The number of the first redistribution patterns 130 stacked between the under-bump patterns 120 and the first redistribution pads 150 may be variously changed without being limited to that as shown in figures.

The first seed patterns 135 may be disposed on bottom surfaces of the first redistribution patterns 130, respectively. For example, each of the first seed patterns 135 may cover a bottom surface of the first wire part included in a corresponding first redistribution pattern 130, and may also cover a bottom surface and a sidewall of the first via part included in the corresponding first redistribution pattern 130. Each of the first seed patterns 135 may not extend onto a sidewall of the first wire part included in the corresponding first redistribution pattern 130. The first seed patterns 135 may include or may be formed of a material different from a material of the under-bump patterns 120 and a material of the first redistribution patterns 130. For example, the first seed patterns 135 may include or may be formed of a conductive seed material. The conductive seed material may include or may be formed of one or more of copper, titanium, and any alloy thereof. The first seed patterns 135 may serve as barrier layers to prevent diffusion of materials included in the first redistribution patterns 130.

The first redistribution pads 150 may be disposed on and coupled to the first redistribution patterns 130. The first redistribution pads 150 may be laterally spaced apart from each other. Each of the first redistribution pads 150 may be coupled to a corresponding under-bump pattern 120 through a lower redistribution pattern and an upper redistribution pattern that are stacked on each other in a slanted manner. In some embodiments, the first redistribution patterns 130 are provided to serve as the lower and upper redistribution patterns, and at least one first redistribution pad 150 may not be vertically aligned with the under-bump pattern 120 that is electrically connected to the at least one first redistribution pad 150. Accordingly, the design freedom of an arrangement of the first redistribution pads 150 may increase. The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The first redistribution pads 150 may be provided in an uppermost first dielectric layer 101, and may extend onto a top surface of the uppermost first dielectric layer 101. As shown in FIG. 1B, each of the first redistribution pads 150 may include a body part 151 and a bonding part 152. The body part 151 may include or may be formed of metal, such as copper. A lower portion of the body part 151 may be disposed in the uppermost first dielectric layer 101. An upper portion of the body part 151 may extend onto the top surface of the uppermost first dielectric layer 101. The bonding part 152 may be provided on the body part 151. The bonding part 152 may have a thickness less than a thickness of the body part 151. The bonding part 152 may include or may be formed of a different material from a material of the body part 151. The bonding part 152 may include or may be formed of one or more of nickel, gold, and any alloy thereof. The bonding part 152 may serve as a protection layer or an adhesion layer. In figures other than FIG. 1B, neither the body part 151 nor the bonding part 152 is illustrated in the interest of brevity, but the present inventive concepts are not intended to exclude any of the body part 151 and the bonding part 152.

The first seed pads 155 may be provided on bottom surfaces of the first redistribution pads 150, respectively. As shown in FIG. 1A, the first seed pads 155 may be provided between the first redistribution pads 150 and the upper redistribution patterns of the first redistribution patterns 130, respectively. The first seed pads 155 may extend between the first redistribution pads 150 and the uppermost first dielectric layer 101, respectively. The first seed pads 155 may include or may be formed of a material different from a material of the first redistribution pads 150. The first seed pads 155 may include or may be formed of, for example, a conductive seed material.

The solder balls 500 may be provided on the bottom surface of the first redistribution substrate 100. For example, the solder balls 500 may be disposed on the bottom surfaces of the under-bump patterns 120, respectively. The solder balls 500 may be coupled to corresponding under-bump patterns 120. The solder balls 500 may be electrically connected through the under-bump patterns 120 to the first redistribution patterns 130. The solder balls 500 may be electrically separated from each other. The solder balls 500 may include or may be formed of a solder material. The solder material may include or may be formed of, for example, tin, bismuth, lead, silver, or any alloy thereof. The solder balls 500 may serve as one of a signal solder ball, a ground solder ball, and a power solder ball.

The semiconductor chip 200 may be mounted on a top surface of the first redistribution substrate 100. When viewed in a plan view, the semiconductor chip 200 may be disposed on a central region of the first redistribution substrate 100. The semiconductor chip 200 may be one of a logic chip, a buffer chip, and a memory chip. For example, the semiconductor chip 200 may be a logic chip. The semiconductor chip 200 may include an application specific integrated circuit (ASIC) chip or an application processor (AP) chip. The ASIC chip may include an application specific integrated circuit (ASIC). In some embodiments, the semiconductor chip 200 may include a central processing unit (CPU) or a graphic processing unit (GPU).

The semiconductor chip 200 may have a top surface and a bottom surface that are opposite to each other. The bottom surface of the semiconductor chip 200 may be an active surface directed toward the first redistribution substrate 100. The top surface of the semiconductor chip 200 may be an inactive surface. For example, the semiconductor chip 200 may include a semiconductor substrate, integrated circuits, and chip pads 230. The semiconductor substrate may include or may be formed of one or more of silicon, germanium, and silicon-germanium. The semiconductor substrate may be a silicon wafer. The integrated circuits may be adjacent to the bottom surface of the semiconductor chip 200. The chip pads 230 may be coupled to the integrated circuits. The phrase "a certain component is electrically connected to the semiconductor chip 200" may mean that "a certain component is electrically connected through the chip pads 230 to the integrated circuits of the semiconductor chip 200."

The semiconductor package 10 may further include bumps 250. The bumps 250 may be interposed between the first redistribution substrate 100 and the semiconductor chip 200. For example, the bumps 250 may be provided between and coupled to the first redistribution pads 150 and the chip pads 230. Therefore, the semiconductor chip 200 may be coupled through the bumps 250 to the first redistribution substrate 100. The bumps 250 may include or may be solder balls. The bumps 250 may include or may be formed of a solder material. The bumps 250 may further include pillar patterns, and the pillar patterns may include or may be formed of metal, such as copper.

The semiconductor package 10 may further include an under-fill layer 410. The under-fill layer 410 may be provided in a gap between the first redistribution substrate 100 and the semiconductor chip 200, thereby covering sidewalls of the bumps 250. The under-fill layer 410 may include or may be formed of a dielectric polymer, such as an epoxy-based polymer.

The conductive structures 300 may be disposed on the top surface of the first redistribution substrate 100. When viewed in a plan view, the conductive structures 300 may be disposed on an edge region of the first redistribution substrate 100. When viewed in a plan view, the edge region of the first redistribution substrate 100 may be provided between the central region and a sidewall of the first redistribution substrate 100. When viewed in a plan view, the edge region may surround the central region of the first redistribution substrate 100.

The conductive structures 300 may be laterally spaced apart from the semiconductor chip 200. The conductive structures 300 may be laterally spaced apart from each other. The conductive structures 300 may be provided on and coupled to corresponding first redistribution pads 150. Therefore, the conductive structures 300 may be coupled to the first redistribution substrate 100. The conductive structures 300 may be electrically connected through the first redistribution substrate 100 to the solder balls 500 or the semiconductor chip 200.

The conductive structures 300 may include signal conductive structures and power supply conductive structures. For example, the signal conductive structures may serve as data signal transfer paths between the first redistribution substrate 100 and the second redistribution substrate 600. The power supply conductive structures may serve as voltage supply paths between the first redistribution substrate 100 and the second redistribution substrate 600. The voltage may be a power voltage or a ground voltage. For example, the voltage supply conductive structures may be ground/power conductive structures. The voltage supply conductive structures may be electrically separated from the signal conductive structures.

Each of the conductive structures 300 may include a corresponding one of first conductive structures 310 and a corresponding one of second conductive structures 320. For example, the signal conductive structures and the voltage supply conductive structures may each include a corresponding one of the first conductive structures 310 and a corresponding one of the second conductive structures 320. The first conductive structures 310 may be laterally spaced apart from each other. The second conductive structures 320 may be laterally spaced apart from each other. The following will describe a single first conductive structure 310 and a single second conductive structure 320, unless otherwise described.

The first conductive structure 310 may be disposed on and coupled to a corresponding first redistribution pad 150. Therefore, the first conductive structure 310 may be coupled to the first redistribution substrate 100. The first conductive structure 310 may be electrically connected through the first redistribution substrate 100 to the semiconductor chip 200 or one of the solder balls 500. The first conductive structure 310 may be cylindrical metal post. The first conductive structure 310 may include or may be formed of metal, such as copper and tungsten. The first conductive structure 310 may include or may be formed of a different material from a material of the solder balls 500.

The first conductive structure 310 may have a first width W1. The first width W1 may be a width at an upper portion or a top surface 310a of the first conductive structure 310. The width at the upper portion of the first conductive structure 310 may be substantially uniform. A width at an intermediate of the first conductive structure 310 may be substantially the same as the first width W1. The intermediate portion of the first conductive structure 310 may be interposed between the upper and lower portions of the first conductive structure 310. For example, the intermediate portion of the first conductive structure 310 may be located at a higher level than an undercut 317 which will be discussed below. The phrase "certain components are the same in terms of thickness, level, width, or length" may mean that an indicated thickness, level, or length include an allowable tolerance possibly occurring during fabrication process. A level of a certain component may indicate a vertical level. Terms such as "same," "equal," "planar," "coplanar," "uniform," or "perpendicular" as used herein encompass near identicality including variations that may occur, for example, due to manufacturing processes. The term "substantially" may be used herein to emphasize this meaning, unless the context or other statements indicate otherwise.

The first conductive structure 310 may have a first height H1. The first height H1 may be relatively small. For example, the first height H1 may range from about 20 μm to about 30 μm. When the first height H1 is less than about 20 μm, there may occur limitations imposed on thickness of the semiconductor chip 200. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first conductive structure 310 may have a first sidewall 310c and an undercut 317. The first sidewall 310c of the first conductive structure 310 may be substantially perpendicular to the top surface 310a of the first conductive structure 310. For example, an angle between the first sidewall 310c and the top surface 310a of the first conductive structure 310 may range from about 85° to about 95°.

The second conductive structure 320 may be disposed on and electrically connected to the first conductive structure 310. The second conductive structure 320 may include or may be a metal post. The metal post may have, for example, a cylindrical shape. According to some embodiments, a bottom surface of the second conductive structure 320 may contact the top surface 310a of the first conductive structure 310. For example, the bottom surface of the second conductive structure 320 may be in direct contact with the top surface 310a of the first conductive structure 310. The second conductive structure 320 may include or may be formed of the same material as a material of the first conductive structure 310. The second conductive structure 320 may include or may be formed of, for example, copper. In some embodiments, the first conductive structure 310 and the second conductive structure 320 may be formed using separate electroplating processes, and the microstructure of the first conductive structure 310 (i.e., the microstructure of copper film of the first conductive structure 310) may be different from the microstructure of the second conductive structure 320 (i.e., the microstructure of copper film of the second conductive structure 320). The copper film of each of the first conductive structure 310 and the second conductive structure 320 may be in a polycrystalline structure having a plurality of grains. The second conductive structure 320 may have a grain different from a grain of the first conductive structure 310 connected thereto. For example, the grain in the second conductive structures 320 may have a size different from a size of the grain in the first conductive structure 310. The size of the grain may mean an average size of grains in each of the first conductive structure 310 and the second conductive structure 320. The average size of grains may be an average size of a predetermined number of grains that are randomly chosen. In some embodiments, the size of a grain may be an area of a grain or the largest width of a grain. In some embodiments, a shape or crystal structure of the grain in the second conductive structure 320 may be different from a shape or crystal structure of the grain in the first conductive structure 310.

The second conductive structure 320 may include or may be formed of a different material from a material of the solder balls 500.

When the second conductive structure 320 has a height greater than about 250 μm, the second conductive structure 320 may decrease in structural stability. When the second conductive structure 320 has a height less than about 150 μm, there may occur limitations imposed on thickness of the semiconductor chip 200. According to some embodiments, the second conductive structure 320 may have a second height H2. The second height H2 may range from about 150 μm to about 250 μm.

The second conductive structure 320 may have a second width W2. The second width W2 may be a width at an upper portion or a top surface of the second conductive structure 320. The width at the upper portion of the second conductive structure 320 may be substantially uniform. An intermediate portion of the second conductive structure 320 may be interposed between the upper and lower portions of the second conductive structure 320. A width at the intermediate portion of the second conductive structure 320 may be substantially the same as the second width W2. The intermediate portion of the second conductive structure 320 may be located at a higher level than a protrusion 327 which will be discussed below.

The second conductive structure 320 may have a second sidewall 320c and a protrusion 327. The second sidewall 320c may be substantially perpendicular to the top surface of the second conductive structure 320. For example, an angle between the top surface and the second sidewall 320c of the second conductive structure 320 may range from about 85° to about 95°.

With reference to FIG. 1C, the following will describe the undercut 317 of the first conductive structure 310 and the protrusion 327 of the second conductive structure 320.

The first conductive structure 310 may have the undercut 317. The undercut 317 may be provided at a lower portion of the first sidewall 310c of the first conductive structure 310. For example, the undercut 317 may be recessed from the first sidewall 310c of the first conductive structure 310. For example, the undercut 317 may be recessed along a bottom surface of the first conductive structure 310. The presence of the undercut 317 may cause a width at the bottom surface of the first conductive structure 310 to be less than the first width W1. The undercut 317 may have a width A1 less than the first width W1. For example, the width A1 of the undercut 317 may range from about 3 μm to about 7 μm. The undercut 317 may have a height A2 less than the first height H1. For example, the height A2 of the undercut 317 may range from about 3 μm to about 7 μm.

The protrusion 327 may be provided at a lower portion of the second sidewall 320c of the second conductive structure 320. Therefore, a profile at the lower portion of the second sidewall 320c of the second conductive structure 320 may be different from a profile at the lower portion of the first sidewall 310c of the first conductive structure 310. For example, the protrusion 327 may protrude outwardly from the second sidewall 320c of the second conductive structure 320. The protrusion 327 may extend from the bottom surface of the second conductive structure 320 along the top surface 310a of the first conductive structure 310. For example, the bottom surface of the second conductive structure 320 may include a bottom surface of the protrusion 327. The presence of the protrusion 327 may cause a width at the bottom surface of the second conductive structure 320 to be greater than the second width W2 of the second conductive structure 320.

The protrusion 327 may have a width B1 less than the second width W2. The width B1 of the protrusion 327 may range from about 3 μm to about 7 μm. The protrusion 327 may have a height B2 less than the second height (see H2 of FIG. 1B). For example, the height B2 of the protrusion 327 may range from about 3 μm to about 7 μm.

The second width W2 may be less than the first width W1. The width at the bottom surface of the second conductive structure 320 may be the same as or less than the first width W1. For example, the second conductive structure 320 may expose an edge region at the top surface 310a of the first conductive structure 310. The edge region at the top surface 310a of the first conductive structure 310 may be in contact with the molding layer 400 which will be discussed below.

According to some embodiments, a difference between the first width W1 and the second width W2 may range from about 20 μm to about 30 μm. When the difference between the first width W1 and the second width W2 is less than about 20 μm, it may be difficult to satisfactorily form the second conductive structure 320. When the difference between the first width W1 and the second width W2 is greater than about 30 μm, the first conductive structure 310 may impose limitations on an arrangement of the semiconductor chip 200 or the second conductive structure 320 may decrease in structural stability. The reduction in structural stability of the second conductive structure 320 may occur due to an excessively large aspect ratio of the second conductive structure 320.

Referring back to FIGS. 1A and 1B, the semiconductor package 10 may further include a conductive seed pattern 350. The conductive seed pattern 350 may be disposed between and coupled to the conductive structure 300 and a corresponding first redistribution pad 150. For example, as shown in FIG. 1B, the conductive seed pattern 350 may be coupled to the bonding part 152. The conductive seed pattern 350 may have a width that is substantially the same as or similar to the width at the bottom surface of the first conductive structure 310. The width of the conductive seed pattern 350 may be less than the first width W1. The conductive seed pattern 350 may include or may be formed of a different material from a material of the first redistribution pad 150 and a material of the first conductive structure 310. For example, the conductive seed pattern 350 may include or may be formed of a conductive seed material.

The molding layer 400 may be disposed on a top surface of the first redistribution substrate 100. The molding layer 400 may bottom and lateral surfaces of the semiconductor chip 200, the first sidewall 310c of the first conductive structure 310, and the second sidewall 320c of the second conductive structure 320. The molding layer 400 may further cover a sidewall of the conductive seed pattern 350.

As shown in FIG. 1C, the molding layer 400 may extend into the undercut 317 of the first conductive structure 310. The molding layer 400 may fill the undercut 317 (i.e., a region defined by the undercut 317) and may contact an inner sidewall of the undercut 317. The molding layer 400 may cover the edge region at the top surface 310a of the first conductive structure 310. The molding layer 400 may cover the protrusion 327 of the second conductive structure 320.

As shown in FIGS. 1A and 1B, the molding layer 400 may have a top surface coplanar with top surfaces of the conductive structures 300. For example, the top surface of the molding layer 400 may be located at substantially the same level as the top surface of the second conductive structure 320. The molding layer 400 may include or may be formed of a dielectric polymer, such as an epoxy-based molding compound. The molding layer 400 may include or may be formed of a dielectric polymer different from a dielectric polymer of the under-fill layer 410. In some embodiments, the under-fill layer 410 may be omitted, and the molding layer 400 may further extend into a gap between the first redistribution substrate 100 and the semiconductor chip 200.

The second redistribution substrate 600 may be disposed on the molding layer 400 and the conductive structures 300, and may be electrically connected to the conductive structures 300. For example, the second redistribution substrate 600 may cover the semiconductor chip 200 and may be spaced apart from the top surface of the semiconductor chip 200. The molding layer 400 may fill a gap between the second redistribution substrate 600 and the top surface of the semiconductor chip 200.

The second redistribution substrate 600 may include a second dielectric layer 601, the second redistribution patterns 630, second seed patterns 635 (i.e., third conductive patterns), and second redistribution pads 650. A plurality of second dielectric layers 601 may be provided. The plurality of second dielectric layers 601 may be stacked on the molding layer 400. The second dielectric layers 601 may include or may be formed of a photo-imageable dielectric (PID). For example, the second dielectric layers 601 may include or may be formed of the same material as each other. An indistinct interface may be provided between neighboring second dielectric layers 601. The number of the second dielectric layers 601 may be variously changed. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The second redistribution patterns 630 may be provided on the conductive structures 300. The second redistribution patterns 630 may be laterally spaced apart and electrically separated from each other. Each of the second redistribution patterns 630 may include a second via part and a second wire part. The second via part may be provided in a corresponding second dielectric layer 601. The second via part in a lowermost second redistribution pattern 630 may be provided on the top surface of the second conductive structure 320 that corresponds to the second via part in the lowermost second redistribution pattern 630. The second wire part may be provided on the second via part, and the second wire part and the second via part may be connected with each other without an interface therebetween. The second wire part of each of the second redistribution patterns 630 may extend onto a top surface of a corresponding second dielectric layer 601. The second redistribution patterns 630 may include or may be formed of metal, such as copper.

The second seed patterns 635 may be disposed on bottom surfaces of the second redistribution patterns 630, respectively. For example, each of the second seed patterns 635 may be provided on a bottom surface and a sidewall of the second via part of a corresponding second redistribution pattern 630 and may extend onto a bottom surface of the second wire part of the corresponding second redistribution pattern 630. The second seed patterns 635 may include or may be formed of a material different from a material of the conductive structures 300 and a material of the second redistribution patterns 630. For example, the second seed patterns 635 may include or may be formed of a conductive seed material. The second seed patterns 635 may serve as barrier layers to prevent diffusion of materials included in the second redistribution patterns 630.

The second redistribution pads 650 may be disposed on and coupled to corresponding second redistribution patterns 630. The second redistribution pads 650 may be laterally spaced apart from each other. The presence of the second redistribution patterns 630 may allow at least one second redistribution pad 650 not to be vertically connected to the conductive structure 300 that is electrically connected to the at least one second redistribution pad 650. For example, the at least one second redistribution pad 650 may not vertically overlap corresponding second redistribution patterns 630. In some embodiment, when viewed in a plan view, the at least one second redistribution pad 650 may be laterally spaced apart from corresponding second redistribution patterns 630. Accordingly, the design freedom of an arrangement of the second redistribution pads 650 may increase.

Each of the second redistribution pads 650 may have a lower portion provided in an uppermost second dielectric layer 601. Each of the second redistribution pads 650 may have an upper portion that extends onto a top surface of the uppermost second dielectric layer 601. The second redistribution pads 650 may include or may be formed of metal, such as copper.

The second redistribution substrate 600 may further include second seed pads 655. The second seed pads 655 may be interposed between uppermost second redistribution pads 650 and the second redistribution pads 650, respectively. The second seed pads 655 may include or may be formed of a conductive seed material.

When each of the conductive structures 300 includes a single conductive structure, restriction of an aspect ratio may limit an interval between the first redistribution substrate 100 and the second redistribution substrate 600. For example, when the first conductive structure 310 is omitted, the interval between the first and second redistribution substrates 100 and 600 may be less than about 250 μm. According to some embodiments, because each of the conductive structures 300 includes the first conductive structure 310 and the second conductive structure 320, each of the conductive structures 300 may have a relatively large height H3. For example, the height H3 of each of the conductive structures 300 may be the same as a sum of the first height H1 and the second height H2. For example, the height H3 of each of the conductive structures 300 may range from about 150 μm to about 250 μm. Because the height H3 of each of the conductive structures 300 is equal to or less than about 250 μm, the semiconductor package 10 may become small in size. Because each of the conductive structures 300 is equal to or greater than about 250 μm, there may be a reduction in limitation imposed on the interval between the first and second redistribution substrates 100 and 600. Because each of the conductive structures 300 is equal to or greater than about 250 μm, the semiconductor chip 200 whose thickness is large may be provided between the first redistribution substrate 100 and the second redistribution substrate 600. For example, the semiconductor chip 200 may have a semiconductor substrate whose thickness is increased. The semiconductor substrate of the semiconductor chip 200 may have a high thermal conductivity, and thus the semiconductor chip 200 may increase in thermal radiation properties. The semiconductor substrate of the semiconductor chip 200 may have a relatively large strength, and thus the semiconductor chip 200 may improve in mechanical properties. The semiconductor substrate of the semiconductor chip 200 may have a coefficient of thermal expansion (CTE) less than a CTE of the molding layer 400, and thus the semiconductor chip 200 may be prevented from warpage.

The first height H1 may be about 5% to about 45% of the sum of the first height H1 and the second height H2. Because the first height H1 is equal to or greater than about 5% of the sum of the first and second heights H1 and H2, the semiconductor chip 200 whose thickness is large may be provided between the first and second redistribution substrates 100 and 600. Because the first height H1 is equal to or less than about 45% of the sum of the first and second heights H1 and H2, it may be possible to increase efficiency of removal of a first resist pattern 810 which will be discussed below.

Differently from that shown in the drawings, the semiconductor package 10 may not include the second redistribution substrate 600. Without the second redistribution substrate 600, the top surface of the second conductive structure 320 and the top surface of the molding layer 400 may be exposed.

Figure 2A:
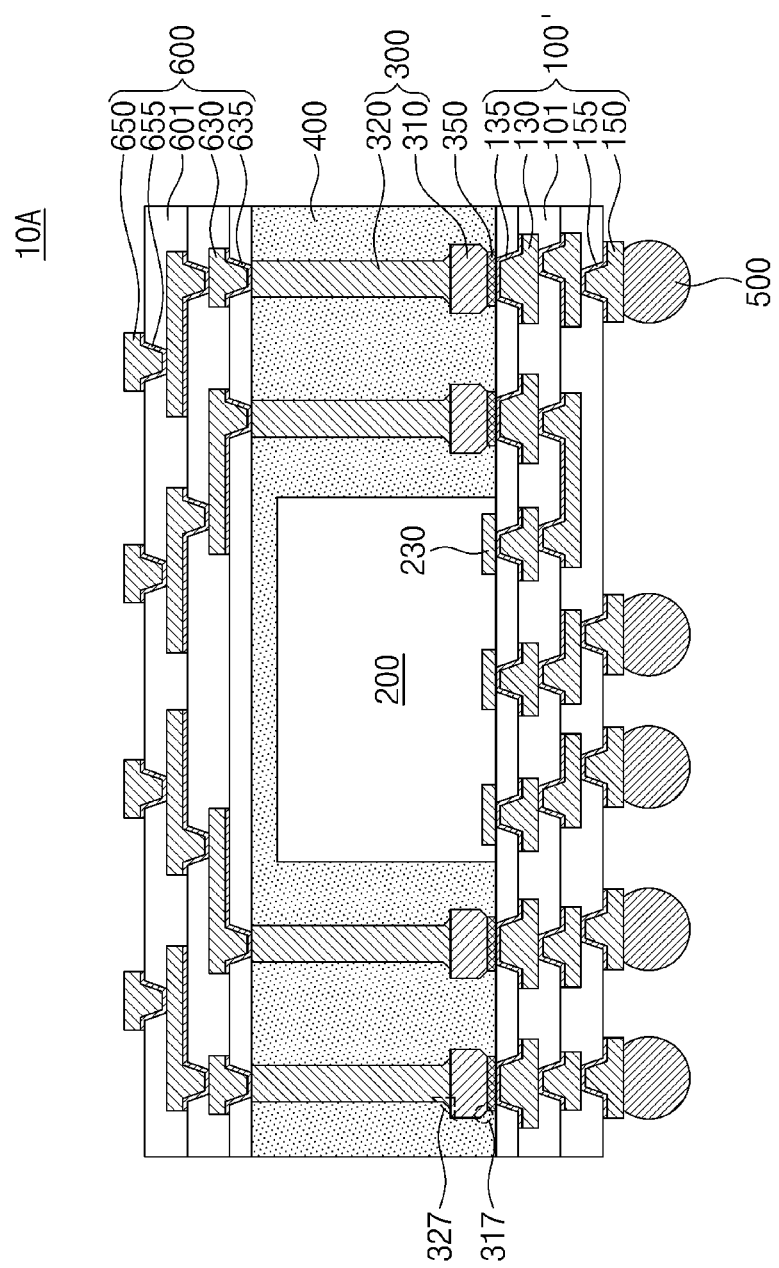
FIG. 2A illustrates a cross-sectional view showing a semiconductor package according to some embodiments.

FIG. 2A illustrates a cross-sectional view showing a semiconductor package according to some embodiments.

Referring to FIG. 2A, a semiconductor package 10A may include a first redistribution substrate 100', solder balls 500, a semiconductor chip 200, conductive structures 300, a molding layer 400, and a second redistribution substrate 600. The semiconductor package 10A may not include any of the bumps 250 and the under-fill layer 410 that are discussed in FIG. 1A.

The first redistribution substrate 100' may include first dielectric layers 101, first redistribution patterns 130, first seed patterns 135, first seed pads 155, and first redistribution pads 150. The first redistribution substrate 100 may not include the under-bump patterns 120 discussed in FIGS. 1A and 1B. The first redistribution substrate 100' may contact the semiconductor chip 200 and the molding layer 400. For example, an uppermost first dielectric layer 101 may contact a bottom surface of the semiconductor chip 200 and a bottom surface of the molding layer 400. The first seed patterns 135 may be provided on top surfaces of the first redistribution patterns 130, respectively. The first seed patterns 135 in the uppermost first dielectric layer 101 may be directly coupled to the chip pads 230 or the conductive seed patterns 350. The first via part of each of uppermost first redistribution patterns 130 may vertically overlap the chip pad 230 or the first conductive structure 310.

The first seed pads 155 may be provided on top surfaces of the first redistribution pads 150, respectively. The first redistribution pads 150 may serve as pads for the solder balls 500. For example, the solder balls 500 may be provided on bottom surfaces of the first redistribution pads 150, respectively.

The semiconductor package 10A may be fabricated by a chip-first process, but the present inventive concepts are not limited thereto. The semiconductor package 10A may be a lower package.

Figure 2B:
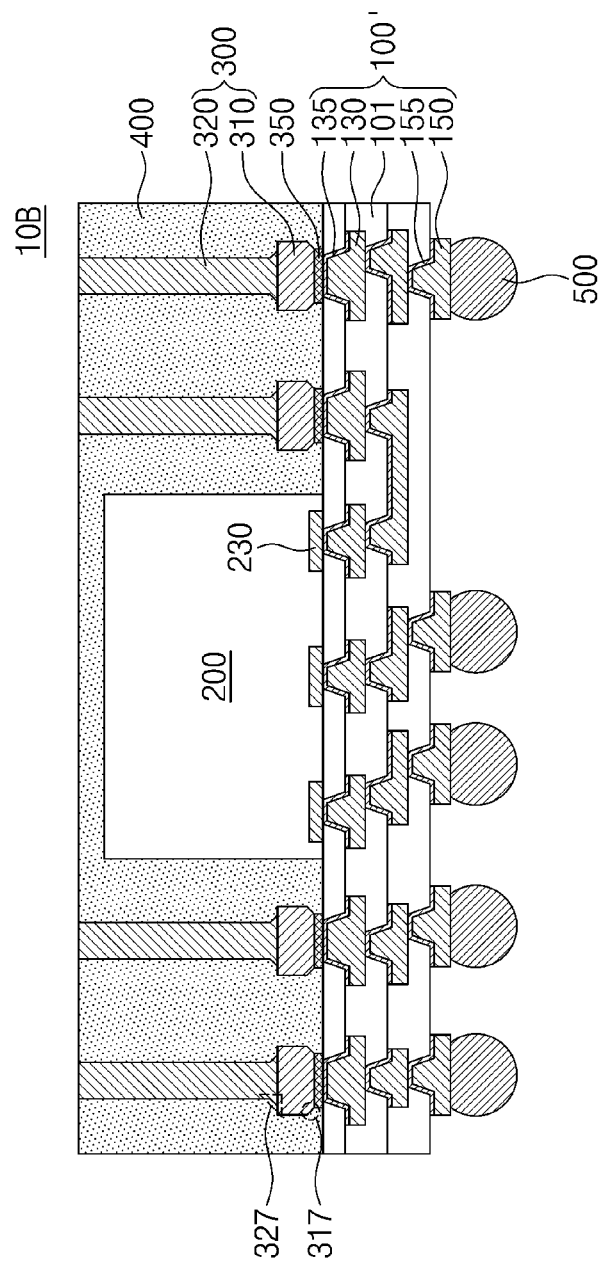
FIG. 2B illustrates a cross-sectional view showing a semiconductor package according to some embodiments.

FIG. 2B illustrates a cross-sectional view showing a semiconductor package according to some embodiments.

Referring to FIG. 2B, a semiconductor package 10B may include a first redistribution substrate 100', solder balls 500, a semiconductor chip 200, conductive structures 300, and a molding layer 400. The semiconductor package 10B may not include any of the bumps 250, the under-fill layer 410, and the second redistribution substrate 600 that are discussed in FIGS. 1A and 1B. The second conductive structure 320 may have a top surface that is exposed by the molding layer 400. The first redistribution substrate 100' may be substantially the same as the first redistribution substrate 100' of FIG. 2A. In some embodiments, the first redistribution substrate 100' may be substantially the same as the first redistribution substrate 100 discussed in FIGS. 1A and 1B.

Figure 3A:
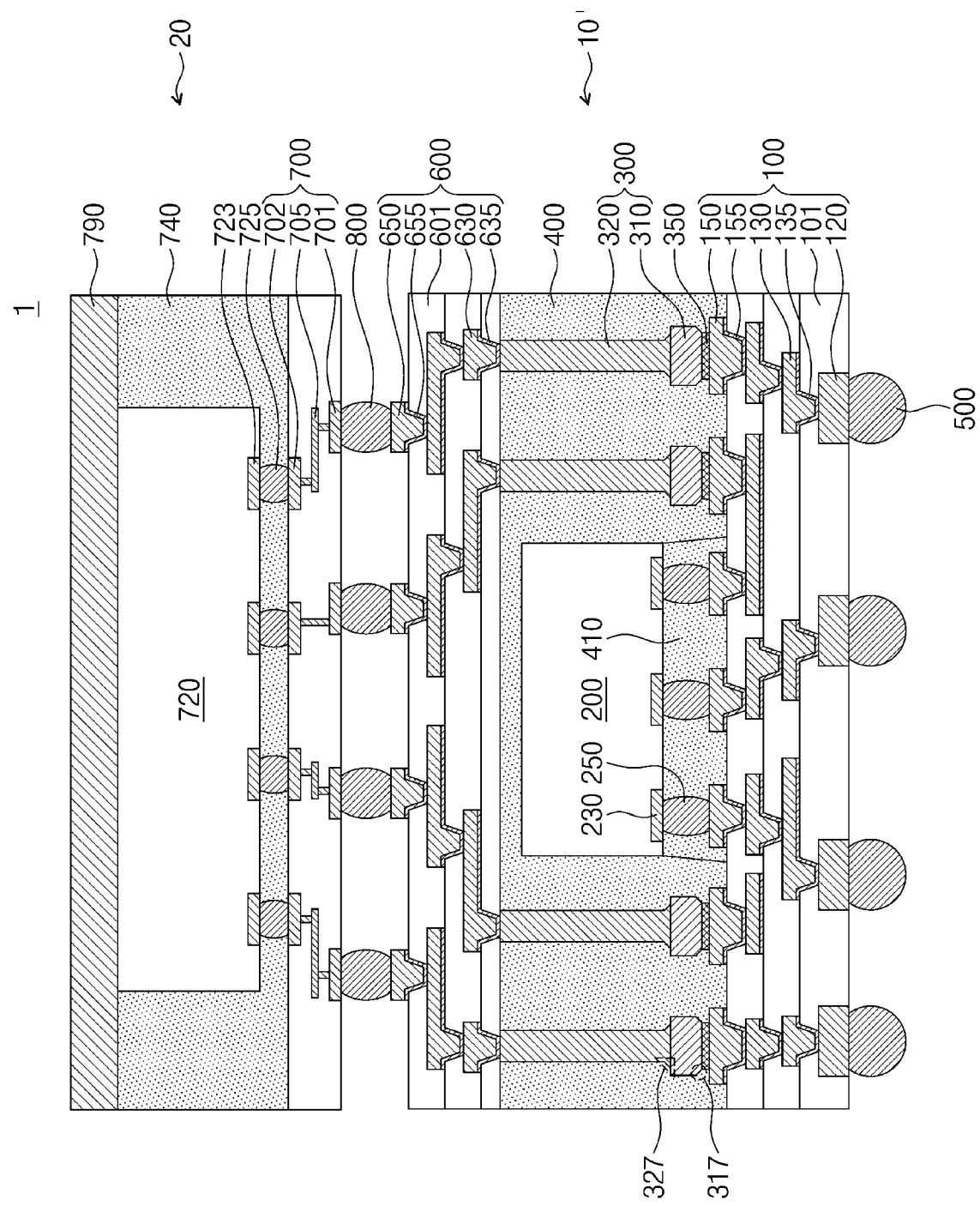
FIG. 3A illustrates a cross-sectional view showing a semiconductor package according to some embodiments.

FIG. 3A illustrates a cross-sectional view showing a semiconductor package according to some embodiments.

Referring to FIG. 3A, a semiconductor package 1 may include a lower package 10', an upper package 20, and connection solders 800. The lower package 10' may be the same as the semiconductor package 10 discussed in the embodiment of FIGS. 1A to 1C. The lower package 10' may include a first redistribution substrate 100, solder balls 500, a semiconductor chip 200, a molding layer 400, conductive structures 300, and a second redistribution substrate 600. In some embodiments, the lower package 10' may be substantially the same as the semiconductor package 10A of FIG. 1A.

The upper package 20 may include an upper substrate 700, an upper semiconductor chip 720, and an upper molding layer 740. The upper substrate 700 may be disposed on and spaced apart from a top surface of the second redistribution substrate 600. The upper substrate 700 may be a printed circuit board (PCB) or a redistribution layer. The upper substrate 700 may include first metal pads 701 disposed at a bottom surface of the upper substrate 700, and may also include second metal pads 702 disposed at a top surface of the upper substrate 700. The upper substrate 700 may be provided therein with metal lines 705 coupled to the first metal pads 701 and the second metal pads 702.

The upper semiconductor chip 720 may be mounted on the upper substrate 700. The upper semiconductor chip 720 may be of a different type from the semiconductor chip 200. For example, the upper semiconductor chip 720 may be a memory chip, and the semiconductor chip 200 may be a logic chip. Upper bumps 725 may be provided between the upper substrate 700 and the upper semiconductor chip 720. The upper bumps 725 may be coupled to the second metal pads 702 and chip pads 723 of the upper semiconductor chip 720, respectively. The upper bumps 725 may include or may be solder balls. In some embodiments, although not shown in the drawings, the upper bumps 725 may further include pillar patterns. The upper semiconductor chip 720 may be coupled through the second redistribution substrate 600 and the conductive structures 300 to the semiconductor chip 200 or the solder balls 500.

The upper molding layer 740 be provided on the upper substrate 700, and may cover the upper semiconductor chip 720. The upper molding layer 740 may expose a top surface of the upper semiconductor chip 720. In some embodiments, differently from that shown in FIG. 3A, the upper molding layer 740 may further cover the top surface of the upper semiconductor chip 720. The upper molding layer 740 may include or may be formed of a dielectric polymer, such as an epoxy-based molding compound.

The connection solders 800 may be interposed between the second redistribution substrate 600 and the upper substrate 700, thereby being coupled to the second redistribution pads 650 and the first metal pads 701. The connection solders 800 may include or may be formed of a solder material. In some embodiments, although not shown in the drawings, the connection solders 800 may further include metal pillar patterns, but the present inventive concepts are not limited thereto.

The upper package 20 may further include a thermal radiation structure 790. The thermal radiation structure 790 may be disposed on a top surface of the upper semiconductor chip 720 and on a top surface of the upper molding layer 740. The thermal radiation structure 790 may further extend onto a lateral surface of the upper molding layer 740. The thermal radiation structure 790 may include a heat sink, a heat slug, or a thermal interface material (TIM) layer. The thermal radiation structure 790 may include or may be formed of, for example, metal.

Figure 3B:
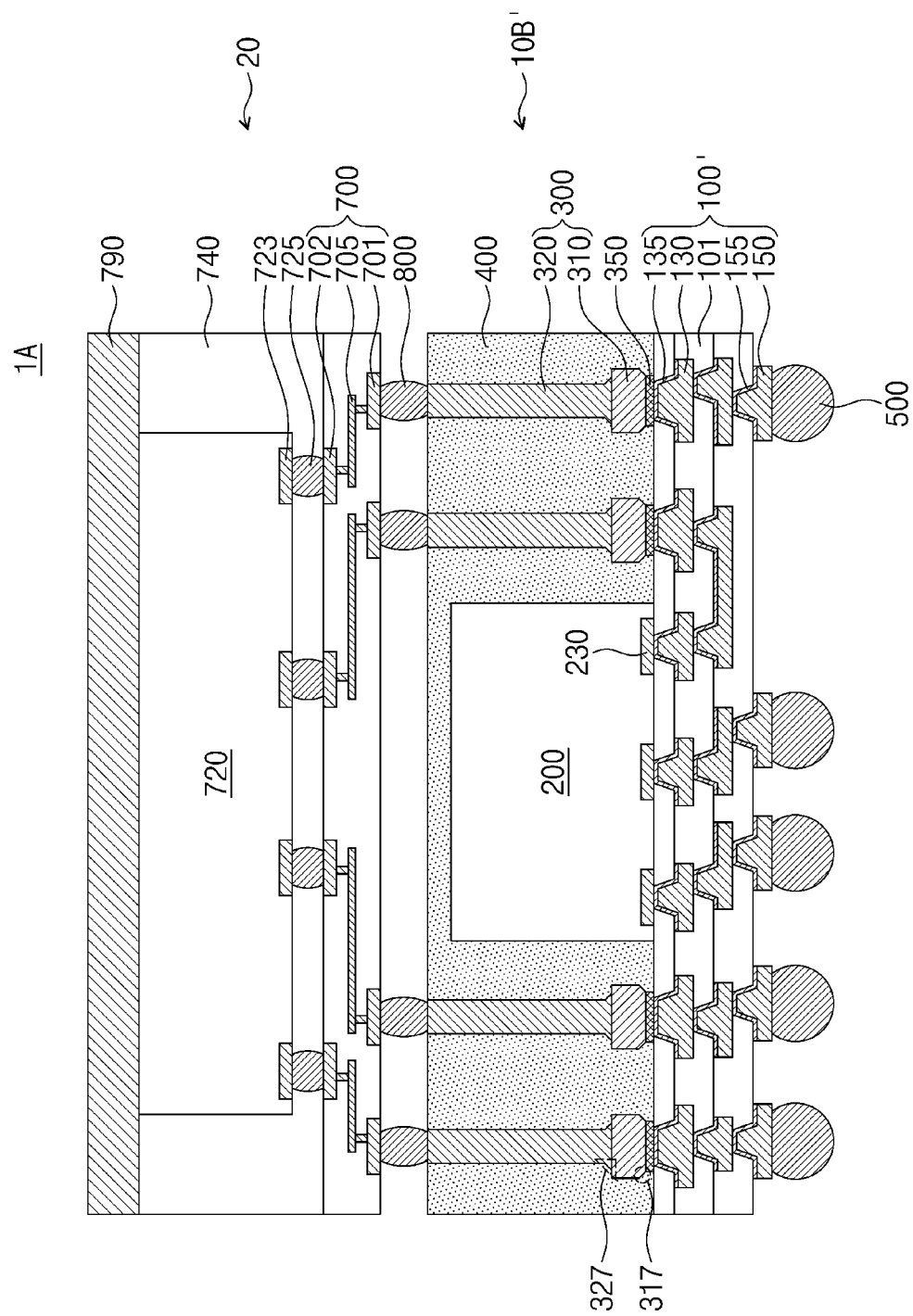
FIG. 3B illustrates a cross-sectional view showing a semiconductor package according to some embodiments.

FIG. 3B illustrates a cross-sectional view showing a semiconductor package according to some embodiments.

Referring to FIG. 3B, a semiconductor package 1A may include a lower package 10B', an upper package 20, and connection solders 800. The lower package 10B' may be substantially the same as the semiconductor package 10B discussed in the embodiment of FIG. 2B. For example, the lower package 10B' may include a first redistribution substrate 100', solder balls 500, a semiconductor chip 200, conductive structures 300, and a molding layer 400. The lower package 10B' may not include the second redistribution substrate 600.

The upper package 20 may be substantially the same as that discussed in FIG. 3A. For example, the upper package 20 may include an upper substrate 700, an upper semiconductor chip 720, upper bumps 725, and an upper molding layer 740. The upper package 20 may further include a thermal radiation structure 790.

The connection solders 800 may be interposed between the upper substrate 700 and a plurality of second conductive structures 320, thereby being coupled to the first metal pads 701 and the second conductive structures 320. For example, the connection solders 800 may contact the top surfaces of the second conductive structures 320.

In some embodiments, differently from that shown, the first redistribution substrate 100' may be substantially the same as the first redistribution substrate 100 discussed in the embodiment of FIGS. 1A and 1B.

FIGS. 4A to 4F, 4H to 4J, and 4L to 4R illustrate cross-sectional views showing a method of fabricating a semiconductor package according to some embodiments. FIG. 4G illustrates an enlarged view showing section II of FIG. 4F. FIG. 4K illustrates an enlarged view showing section II of FIG. 4J. A duplicate description will be omitted below.

Figure 4A:
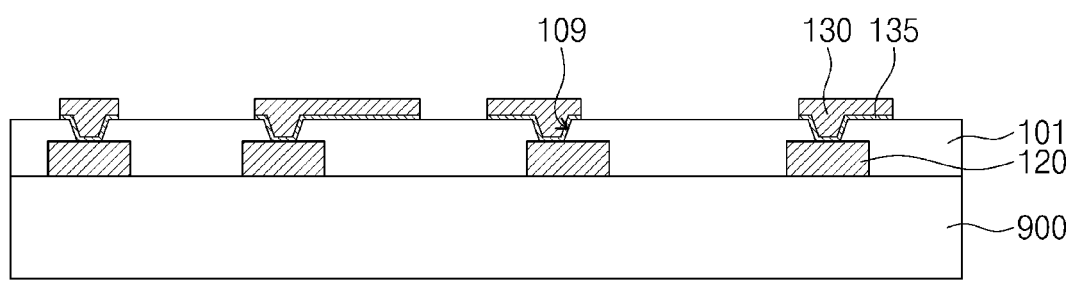
FIGS. 4A to 4R illustrate cross-sectional views showing a method of fabricating a semiconductor package according to some embodiments.

Referring to FIG. 4A, under-bump patterns 120, a first dielectric layer 101, first seed patterns 135, and first redistribution patterns 130 may be formed on a carrier substrate 900.

According to some embodiments, an electroplating process may be performed to form an under-bump pattern 120 on the carrier substrate 900. The first dielectric layer 101 may be formed on the carrier substrate 900 to cover sidewalls and top surfaces of the under-bump patterns 120. First openings 109 may be formed in the first dielectric layer 101 to expose the under-bump patterns 120.

The formation of the first seed patterns 135 and the first redistribution patterns 130 may include forming a first seed layer (not shown) in the first openings 109 and on a top surface of the first dielectric layer 101, forming a resist pattern (not shown) on the first seed layer, performing an electroplating process in which the first seed layer is used as an electrode (i.e., a seed layer) to form the first seed patterns 135 and the first redistribution patterns 130, removing the resist pattern to expose a portion of the first seed layer, and etching the exposed portion of the first seed layer.

The electroplating process may form the first redistribution patterns 130 in the first openings 109 and in a lower portion of the resist pattern. Each of the first redistribution patterns 130 may include a first via part and a first wire part. The first via part may be formed in a corresponding first opening 109, and the first wire part may be formed on the first via part and on the first dielectric layer 101. The etching of the first seed layer may be formed into the first seed patterns 135 that are separated from each other. The first seed patterns 135 may be disposed on bottom surfaces of the first redistribution patterns 130, respectively. For example, in the etching of the seed layer, the first redistribution patterns 130 may serve as etch masks, and portions of the seed layer that remain unetched after the etching of the seed layer may correspond to the first seed patterns 135.

Figure 4B:
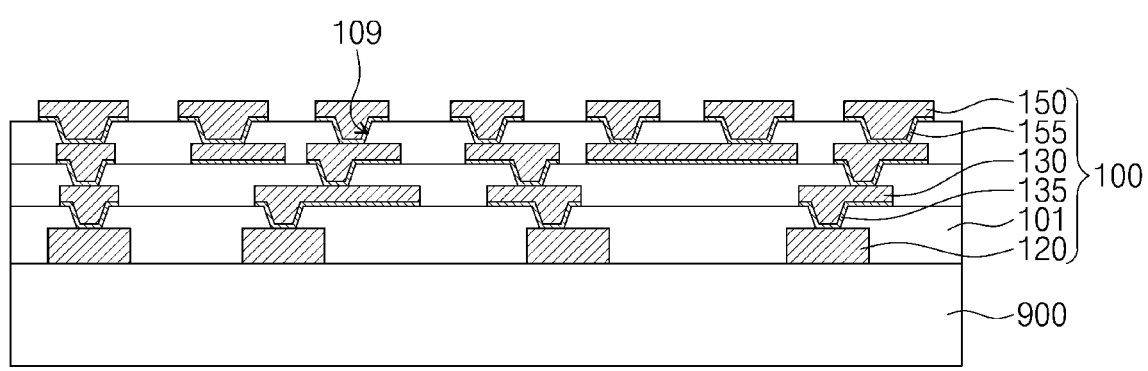

Referring to FIG. 4B, the formation of the first dielectric layer 101, the formation of the first seed patterns 135, and the formation of the first redistribution patterns 130 may be performed repeatedly. Therefore, stacked first dielectric layers 101 may be formed, and stacked first redistribution patterns 130 may be formed.

First redistribution pads 150 may be formed in first openings 109 of an uppermost first dielectric layer 101, respectively. The first redistribution pads 150 may be coupled to the first redistribution patterns 130, respectively. Before the first redistribution pads 150 are formed, first seed pads 155 may be formed. An electroplating process may be performed in which the first seed pads 155 are used as electrodes (i.e., seed layers) to form the first redistribution pads 150. For example, the first redistribution pads 150 may grow from the first seed pads 155, respectively, in an electroplating process to form a first redistribution substrate 100. The first redistribution substrate 100 may include the first dielectric layers 101, the under-bump patterns 120, the first seed patterns 135, the first redistribution patterns 130, the first seed pads 155, and the first redistribution pads 150.

Figure 4C:
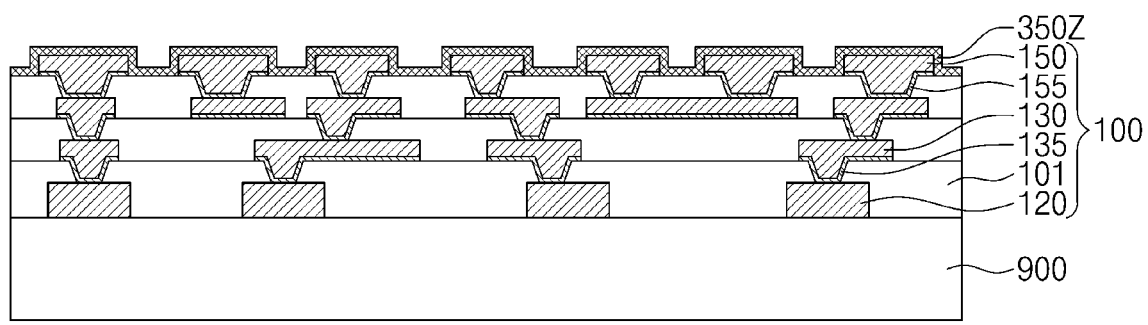

Referring to FIG. 4C, a conductive seed layer 350Z may be formed on a top surface of the first redistribution substrate 100 to cover the first redistribution pads 150 and the uppermost first dielectric layer 101. For example, the conductive seed layer 350Z may cover sidewalls and top surfaces of the first redistribution pads 150 and a top surface of the uppermost first dielectric layer 101.

Figure 4D:
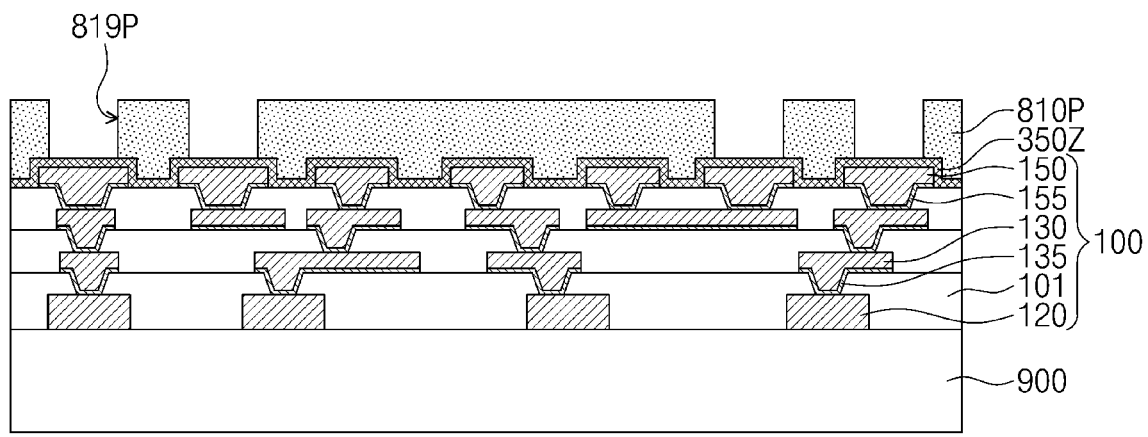

Referring to FIG. 4D, a first preliminary resist pattern 810P may be formed on a top surface of the conductive seed layer 350Z. The first preliminary resist pattern 810P may include or may be formed of an organic material such as a polymer, but the present inventive concepts are not limited thereto. The first preliminary resist pattern 810P may include or may be formed of a positive photoresist material. The first preliminary resist pattern 810P may be patterned by exposure and development processes. First preliminary holes 819P may be formed in the first preliminary resist pattern 810P. The first preliminary holes 819P may expose the conductive seed layer 350Z. The first preliminary holes 819P may have uniform widths. For example, each of the first preliminary holes 819P may have a width at an upper portion which is substantially the same as a width a lower portion.

Figure 4E:
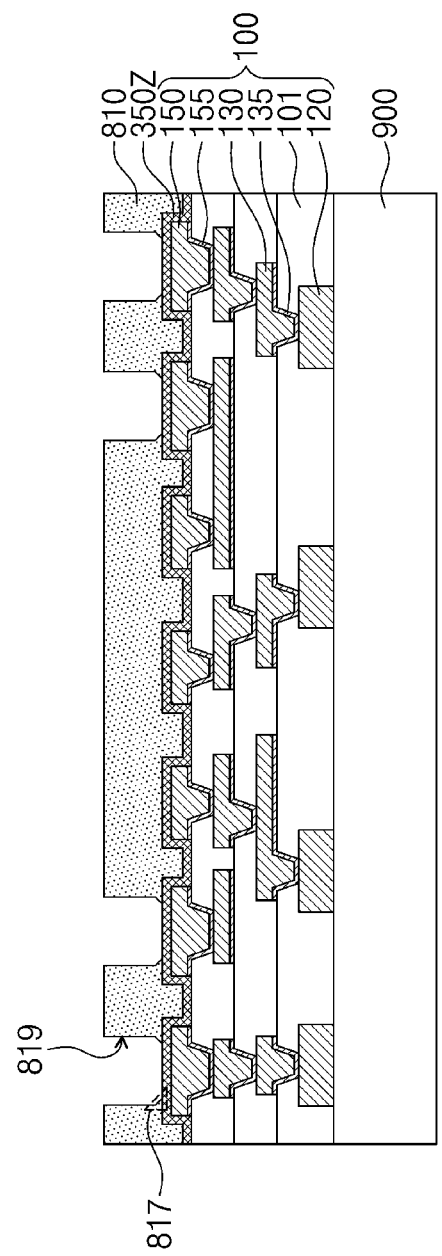

Referring successively to FIGS. 4D and 4E, the first preliminary resist pattern 810P may undergo a curing process to form a first resist pattern 810. For example, a photo-curing process may be performed to cure the first preliminary resist pattern 810P. In the curing process, the positive photoresist material may shrink. Therefore, the first preliminary hole 819P may be formed into a first hole 819. The first hole 819 may have a different shape from the first preliminary hole 819P. For example, the first resist pattern 810 may have a resist protrusion 817. The resist protrusion 817 may protrude from a lower portion of a sidewall of the first hole 819. The resist protrusion 817 may extend along the top surface of the conductive seed layer 350Z.

Figure 4F:
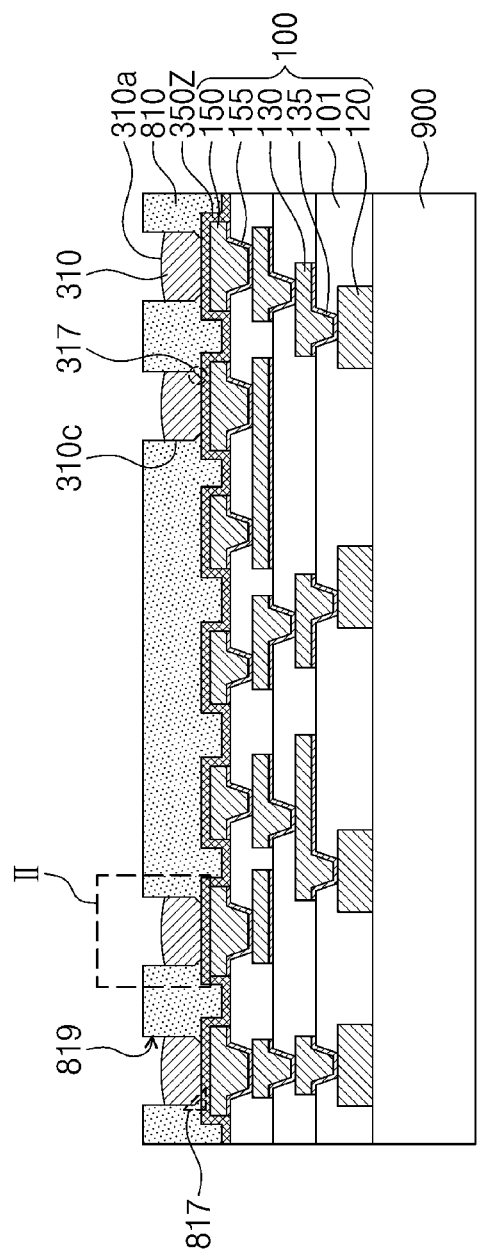
Figure 4G:
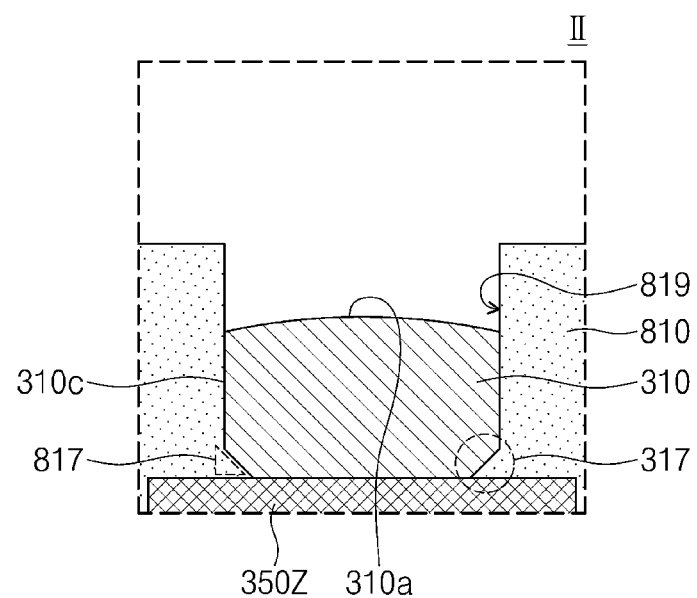

Referring to FIGS. 4F and 4G, a first conductive structure 310 may be formed in the first hole 819 and on the conductive seed layer 350Z. The formation of the first conductive structures 310 may include performing an electroplating process in which the conductive seed layer 350Z is used an electrode (i.e., a seed layer for an electroplating process). The first conductive structure 310 may have a top surface 310a located at a lower level than a top surface of the first resist pattern 810. The electroplating process may be terminated before the first conductive structures 310 extend onto the top surface of the first resist pattern 810. Therefore, no planarization process may be separately required in a process where the first conductive structures 310 are formed. It may be possible to simplify a fabrication process for the first conductive structures 310.

The first conductive structure 310 may have a shape that corresponds to a shape of the first hole 819. For example, the resist protrusion 817 may cause the formation of an undercut 317 of each of the first conductive structure 310. The undercut 317 may be provided at a lower portion of a first sidewall 310c of the first conductive structure 310. The undercut 317 may be substantially the same as an undercut as discussed with reference to the embodiments of FIGS. 1A to 1C.

The first conductive structure 310 may have a dome shape at the top surface 310a. The top surface 310a of the first conductive structure 310 may be upwardly convex.

Figure 4H:
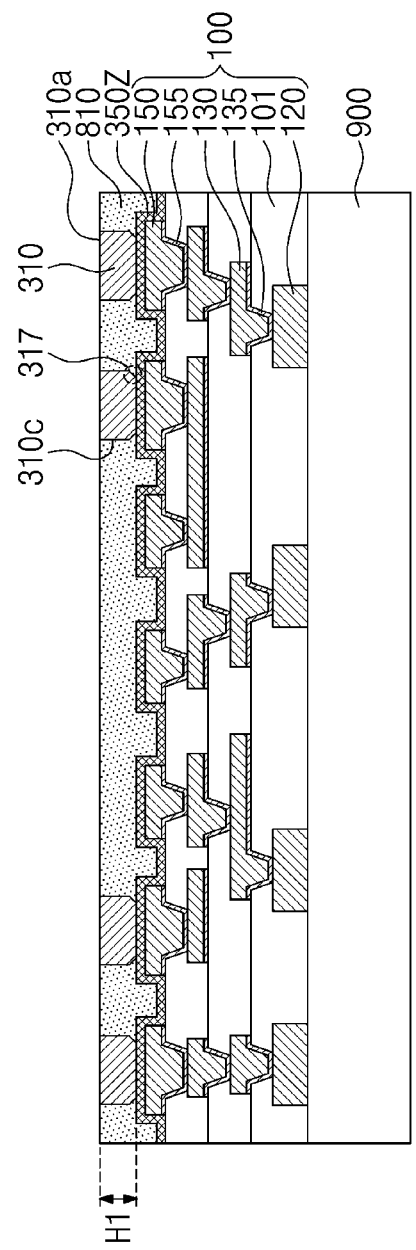

Referring to FIG. 4H, a grinding process may be performed on the first resist pattern 810 and the first conductive structure 310. For example, the grinding process may be accomplished by performing a surface grinding process. The grinding process may remove an upper portion of the first resist pattern 810. The grinding process may be performed on the top surface 310*a* of the first conductive structure 310, thereby removing a portion of the first conductive structure 310. The first conductive structure 310 may have a grinded flat top surface 310*a*. As a result of the grinding process, the top surface 310*a* of the first conductive structure 310 may be coplanar with the top surface of the first resist pattern 810. After the grinding process, the first conductive structures 310 may have a first height H1 that is the same as or similar to a height of the first resist pattern 810. For example, each of the first height H1 and the height of the first resist pattern 810 may range from about 30 μm to about 50 μm. The height of the first resist pattern 810 may be a height on the first redistribution pad 150.

Figure 4I:
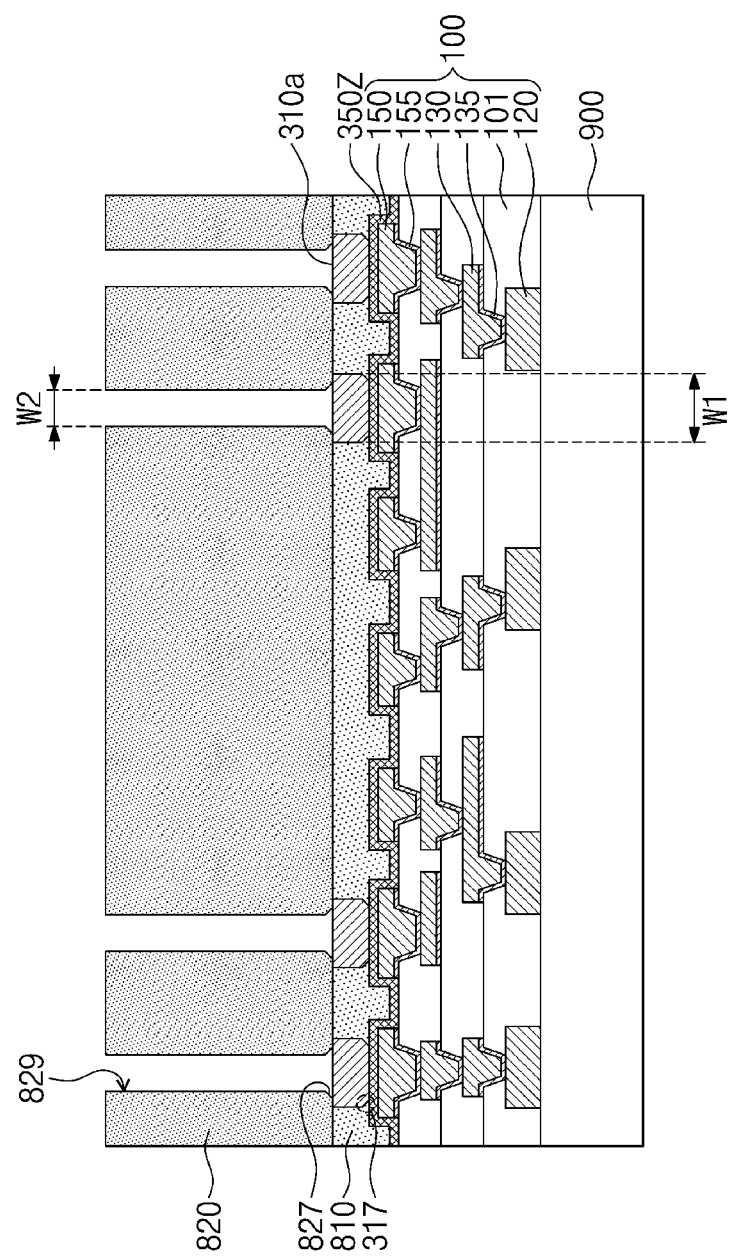

Referring to FIG. 4I, a second resist pattern 820 may be formed on the first resist pattern 810. The second resist pattern 820 may include or may be formed of a negative photoresist material. An exposure process and a development process may be performed to pattern the second resist pattern 820 to form a second preliminary hole (not shown). The second preliminary hole may expose the first conductive structure 310. The second preliminary hole may have a uniform width.

Afterwards, a curing process may be performed on the second resist pattern 820. For example, a photo-curing process may be performed to cure the second resist pattern 820. In the curing process, the negative photoresist material may shrink. The curing process may convert the second preliminary hole into a second hole 829. The second hole 829 may expose the top surface 310*a* of the first conductive structure 310. The second hole 829 may have a different shape from that of the second preliminary hole. For example, the second resist pattern 820 may have a recess 827. The recess 827 may be formed in a lower portion of a sidewall of the second hole 829. The recess 827 may expose at least a portion of the top surface 310*a* of the first conductive structure 310. A width at a bottom surface of the second hole 829 may be less than a width at an upper portion of the second hole 829. The width at the upper portion of the second hole 829 and the width at the bottom surface of the second hole 829 may each be less than a first width W1 of the first conductive structure 310.

Figure 4J:
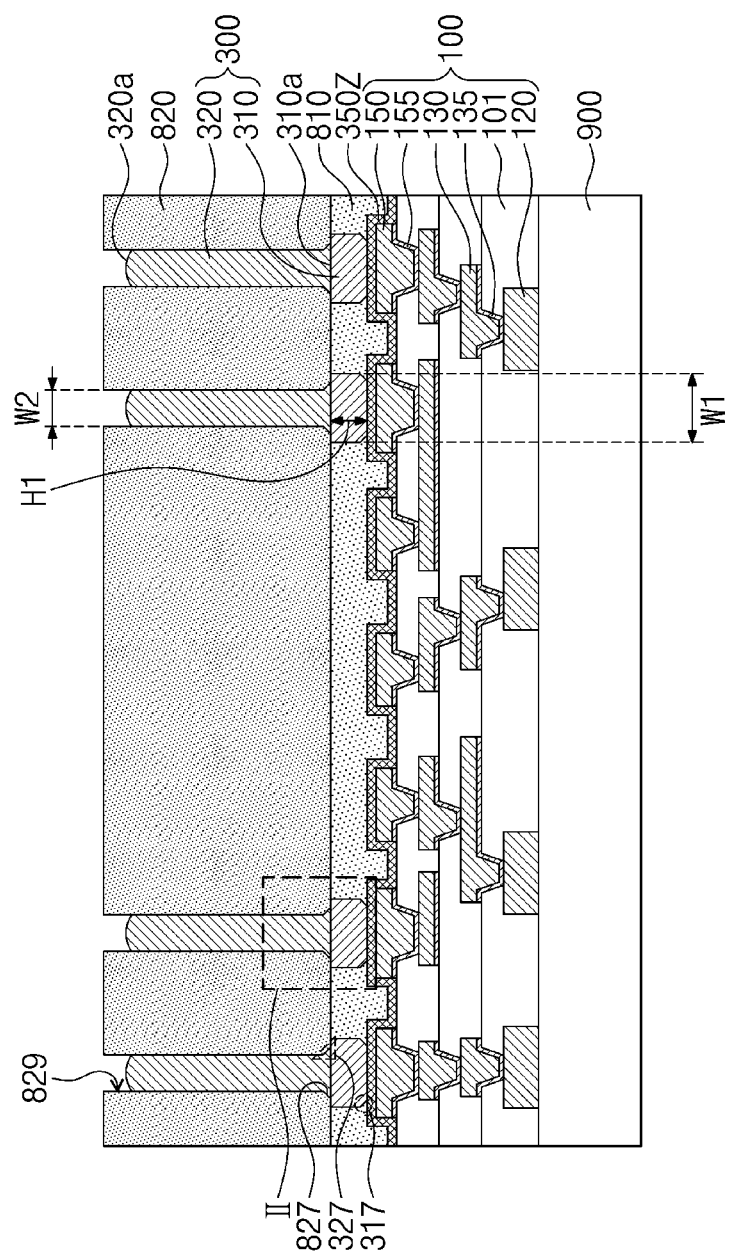
Figure 4K:
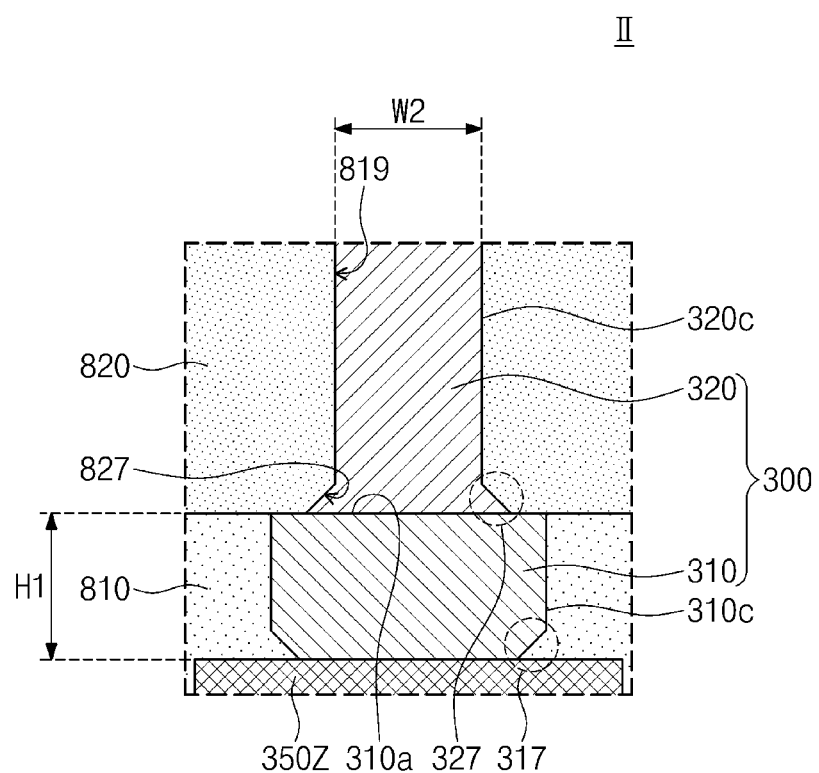

Referring to FIGS. 4J and 4K, a second conductive structure 320 may be formed in the second hole 829 and on the first conductive structure 310. The formation of the second conductive structure 320 may include performing an electroplating process in which the first conductive structure 310 is used as an electrode (i.e., a seed layer for an electroplating process). In some embodiments, the first and second conductive structures 310 and 320 may be formed using separate electroplating processes, and the microstructure of the first conductive structure 310 (i.e., the microstructure of copper film of the first conductive structure 310) may be different from the microstructure of the second conductive structure 320 (i.e., the microstructure of copper film of the second conductive structure 320). The copper film of each of the first conductive structure 310 and the second conductive structure 320 may be in a polycrystalline structure having a plurality of grains. The second conductive structure 320 may include or may be formed of the same material as a material of the first conductive structure 310, but may have a different grain from a grain of the first conductive structure 310. The electroplating process may be terminated before the second conductive structure 320 extends onto a top surface of the second resist pattern 820. The second conductive structure 320 may have a top surface 320*a* located at a lower level than the top surface of the second resist pattern 820. Therefore, no planarization process may be separately required in a process where the second conductive structures 320 are formed. It may be possible to simplify a fabrication process for the second conductive structures 320.

The second conductive structure 320 may have a second width W2 that is the same as the width at the upper portion of the second hole 829. The second width W2 and the width at the upper portion of the second hole 829 may each be less than the first width W1. For example, when a value of less than about 20 μm is given to a difference between the second width W2 and the first width W1 or a difference between the first width W1 and the width at the upper portion of the second hole 829, it may be difficult to satisfactorily form the second conductive structure 320. According to some embodiments, because the difference between the second width W2 and the first width W1 is in a range of about 20 μm to about 30 μm, even when a process error is generated in the middle of the formation of the second hole 829, the first resist pattern 810 may not be exposed by the second hole 829. The electroplating process, in which the first conductive structures 310 is used as electrodes (i.e., a seed layer for the electroplating process), may satisfactorily form the second conductive structure 320 on the first conductive structure 310.

The second conductive structure 320 may have a shape that corresponds to a shape of the second hole 829. The presence of the recess 827 may cause the second conductive structure 320 to have a protrusion 327. The protrusion 327 may be provided at a lower portion of a second sidewall 320*c* of the second conductive structure 320. The protrusion 327 may be substantially the same as that discussed in the embodiments of FIGS. 1A to 1C.

The second conductive structure 320 may have a dome shape at the top surface 320*a*. The top surface 320*a* of the second conductive structure 320 may be upwardly convex.

Figure 4L:
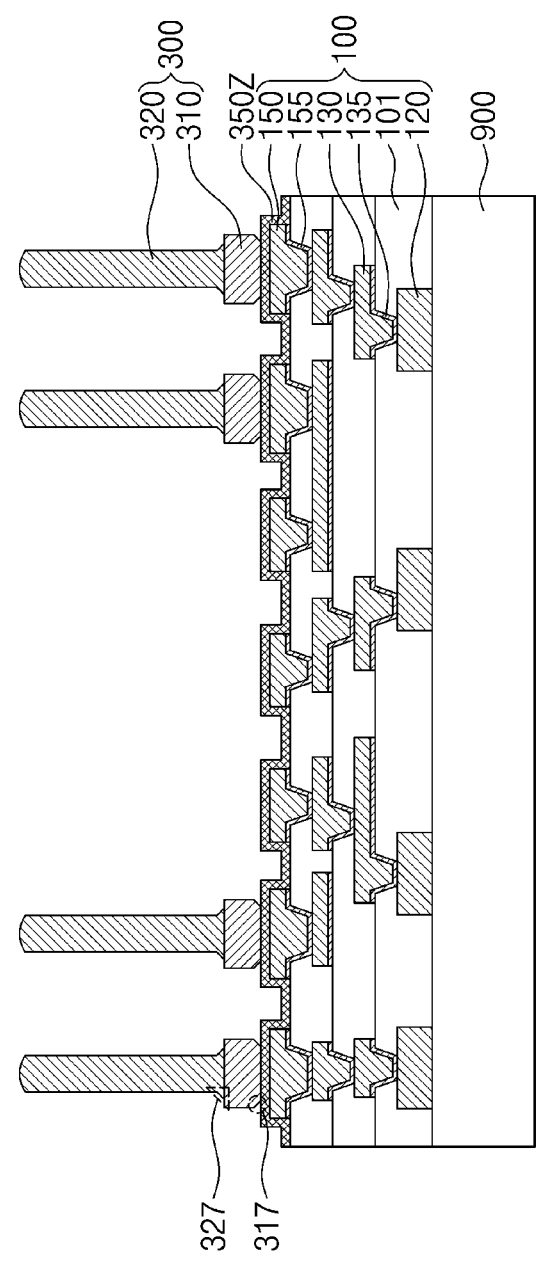

Referring successively to FIGS. 4J and 4L, the second resist pattern 820 and the first resist pattern 810 may be removed to expose the conductive seed layer 350Z. According to some embodiments, a stripper may be used to remove the first resist pattern 810. The second resist pattern 820 may be removed by a lift-off process. For example, when the first resist pattern 810 is removed, the second resist pattern 820 may also be removed together with the first resist pattern 810. Therefore, it may be possible to omit a strip process of the second resist pattern 820.

When each of the first height H1 and the height of the first resist pattern 810 is greater than about 50 μm, there may be a reduction in efficiency of removing the first resist pattern 810. According to some embodiments, because each of the first height H1 and the height of the first resist pattern 810 is equal to or less than about 50 μm, it may be possible to increase efficiency of removing the first resist pattern 810.

When the first resist pattern 810 includes or is formed of the same kind of resist material as a resist material of the second resist pattern 820, the second resist pattern 820 may require a strip process. Because the second resist pattern 820 has a relatively large height, the strip process of the second resist pattern 820 may consume a long process time. According to some embodiments, the second resist pattern 820 may be removed by a lift-off process used for removing the first resist pattern 810, and thus it may be possible to increase efficiency of semiconductor package fabrication process.

Figure 4M:
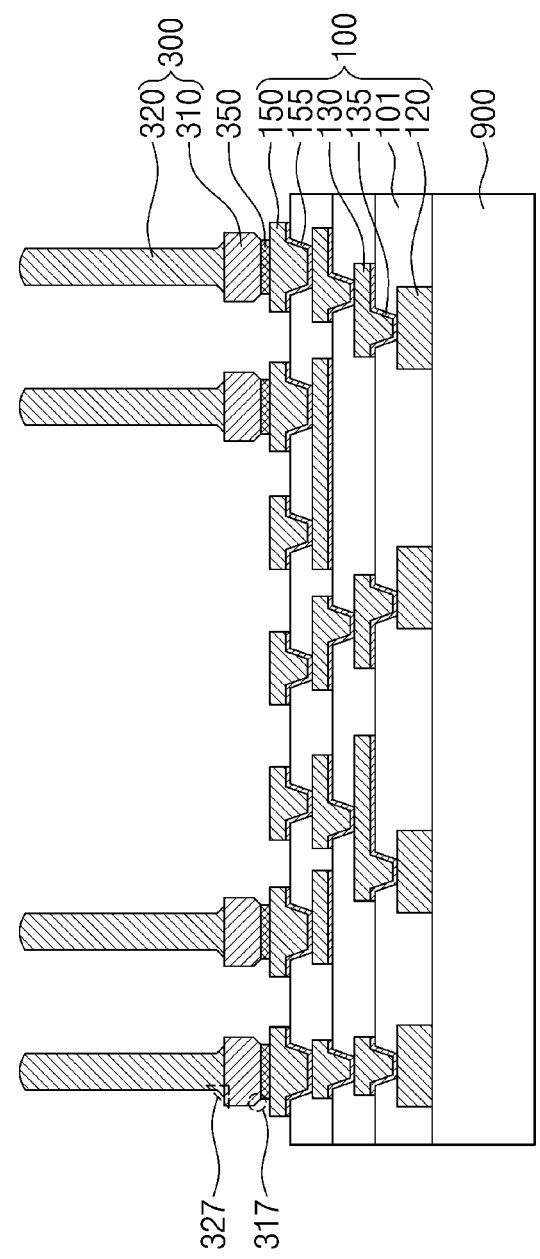

Referring to FIG. 4M, the conductive seed layer 350Z may be patterned to form conductive seed patterns 350. An etching process may be performed to pattern the conductive seed layer 350Z. In the etching process, a first part of the conductive seed layer 350Z may be removed to expose the first redistribution substrate 100. For example, the uppermost first dielectric layer 101 may be exposed, and the first redistribution pads 150 may also be exposed. In the etching process, the conductive structures 300 may have etch selectivity with respect to the conductive seed layer 350Z. Second parts of the conductive seed layer 350Z may be provided on bottom surfaces of the conductive structures 300. For example, each of the second parts of the conductive seed layer 350Z may be provided on a bottom surface of a corresponding one of the first conductive structures 310. The second parts of the conductive seed layer 350Z may not be exposed to the etching process. After the etching process is terminated, the second parts of the conductive seed layer 350Z may be formed into the conductive seed patterns 350. The conductive seed patterns 350 may be spaced apart and electrically separated from each other.

Figure 4N:
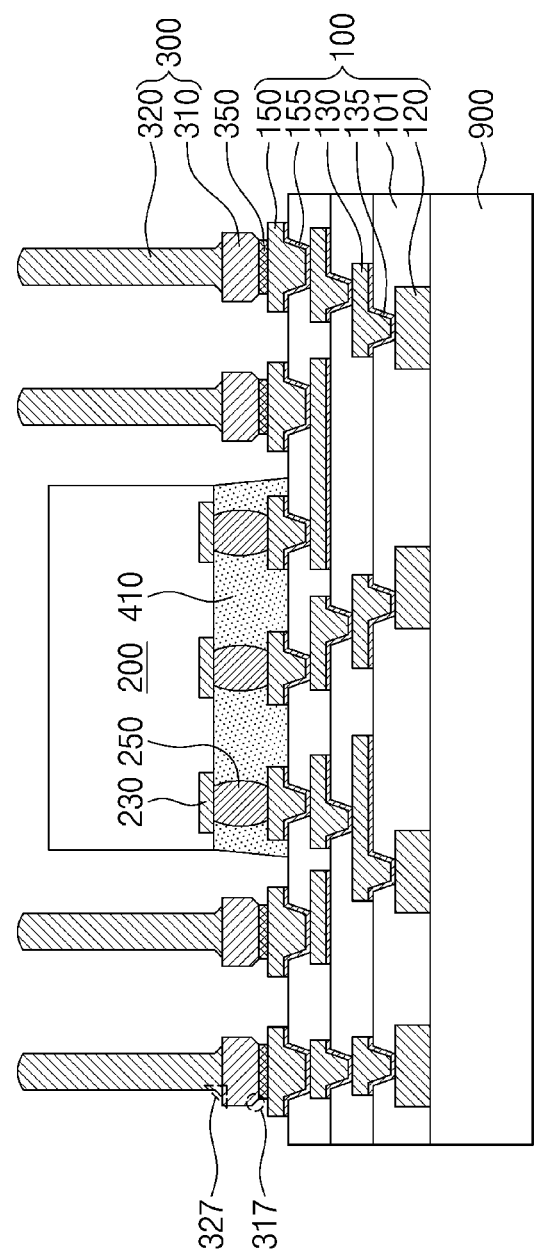
Figure 40:
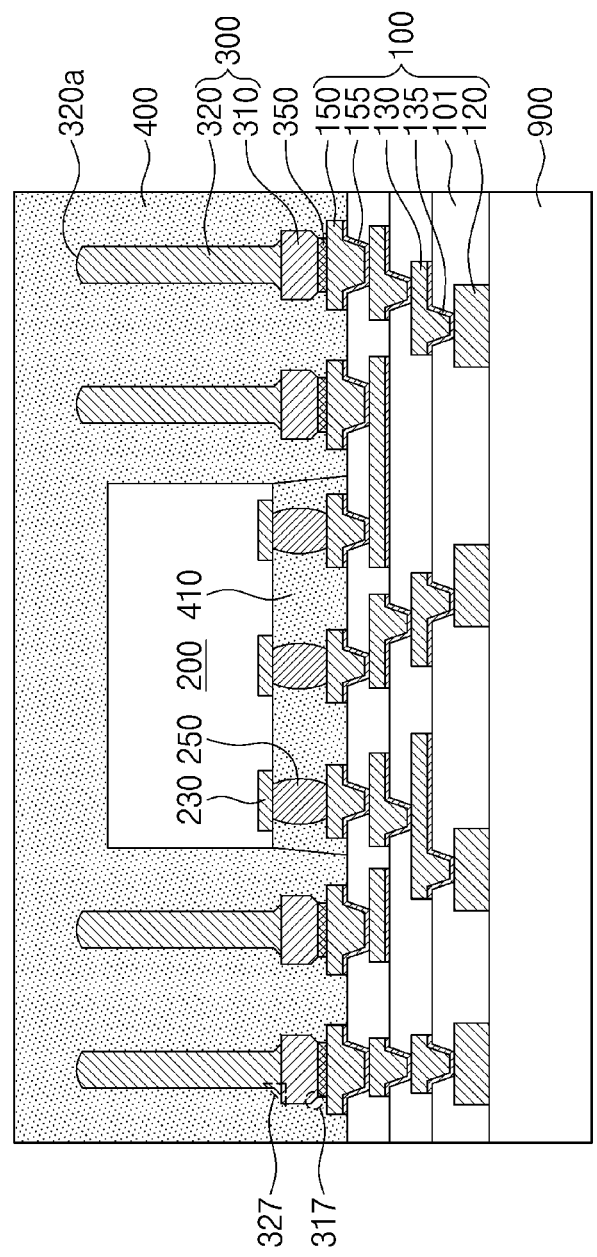

Referring to FIG. 4N, a semiconductor chip 200 may be mounted on a top surface of the first redistribution substrate 100. The mounting of the semiconductor chip 200 may include forming bumps 250 between the first redistribution substrate 100 and the semiconductor chip 200. The bumps 250 may be coupled to the first redistribution pads 150 and to chip pads 230 of the semiconductor chip 200. An underfill layer 410 may further be formed between the first redistribution substrate 100 and the semiconductor chip 200.

Referring to FIG. 4O, a molding layer 400 may be formed on the top surface of the first redistribution substrate 100 to cover the semiconductor chip 200 and the conductive structures 300. The molding layer 400 may have a top surface located at a higher level than a top surface of the semiconductor chip 200 and the top surface 320a of the second conductive structure 320.

Figure 4P:
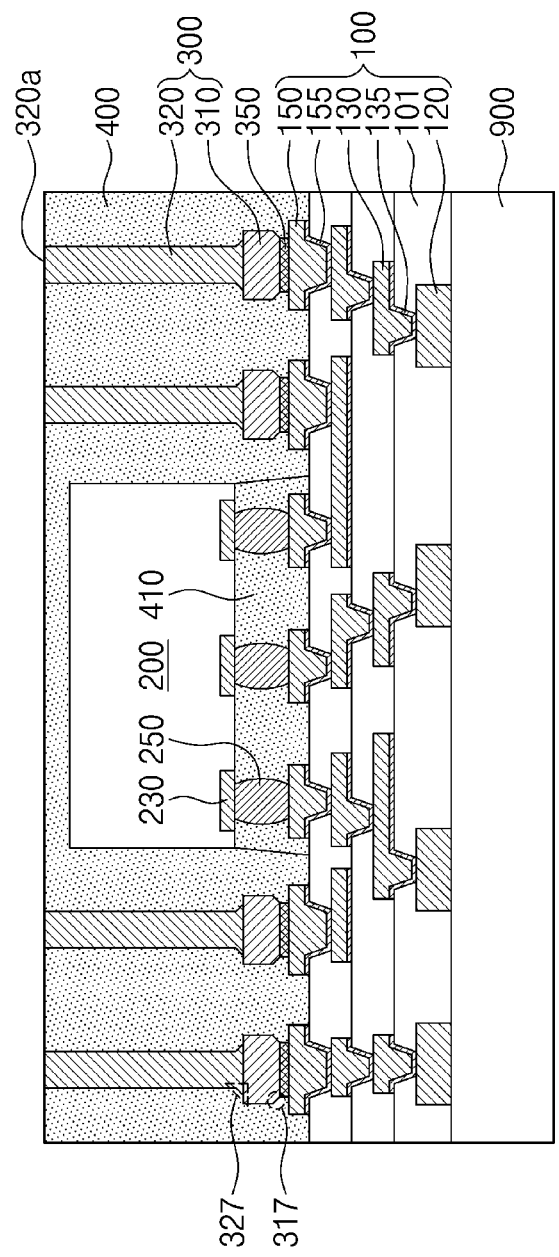

Referring to FIG. 4P, the molding layer 400 may undergo a grinding process to expose the second conductive structure 320. For example, the grinding process may be executed by performing a chemical mechanical polishing process. In some embodiments, after the exposure of the top surface 320a of the second conductive structure 320, the grinding process may further be performed on the exposed second conductive structure 320. A portion of the second conductive structure 320 may further be removed. The second conductive structure 320 may have a grinded flat top surface 320a. The top surface of the molding layer 400 may be coplanar with the grinded top surfaces 320a of the conductive structures 300. For example, the grinding process may be terminated before the top surface of the semiconductor chip 200 is exposed. The molding layer 400 may cover the top surface of the semiconductor chip 200. The second conductive structure 320 may be provided in plural.

Figure 4Q:
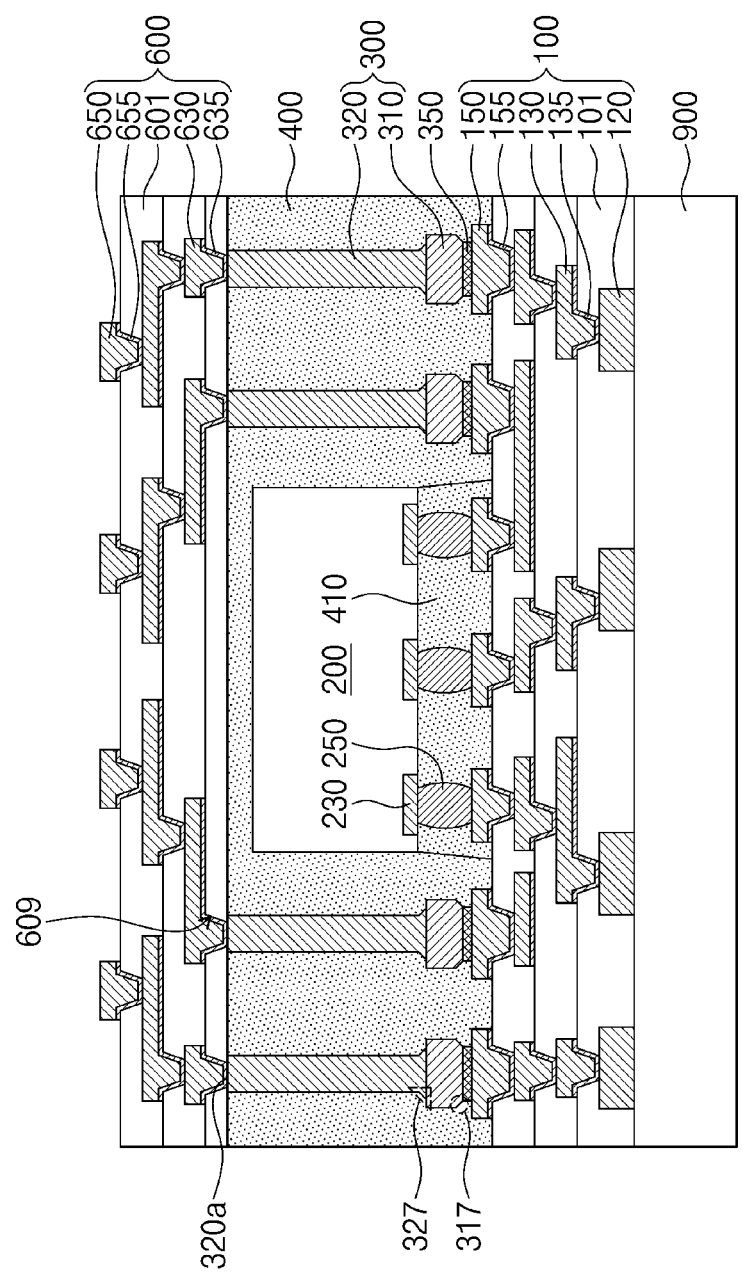

Referring to FIG. 4Q, a second redistribution substrate 600 may be formed on the molding layer 400 and the conductive structures 300. According to some embodiments, a second dielectric layer 601 may be formed on the top surface of the molding layer 400. Second openings 609 may be formed in the second dielectric layer 601 to expose the top surfaces 320a of the plurality of second conductive structures 320.

Second seed patterns 635 may be formed in the second openings 609 and on a top surface of the second dielectric layer 601. Second redistribution patterns 630 may be formed in the second openings 609 and on the top surface of the second dielectric layer 601, thereby covering the second seed patterns 635.

Each of the second redistribution patterns 630 may include a second via part and a second wire part. The second via part may be formed in a corresponding second opening 609. The second wire part may be formed on the second via part and may extend onto the top surface of the second dielectric layer 601. The formation of the second seed patterns 635 may be identical or similar to the formation of the first redistribution patterns 130 discussed in FIG. 4A, and the formation of the second redistribution patterns 630 may be identical or similar to the formation of the first seed patterns 135 discussed in FIG. 4A. The formation of the second dielectric layer 601, the formation of the second seed patterns 635, and the formation of the second redistribution patterns 630 may be performed repeatedly. Accordingly, there may be formed a plurality of stacked second dielectric layers 601, a plurality of second seed patterns 635, and a plurality of stacked second redistribution patterns 630.

Second redistribution pads 650 may be formed in an uppermost second dielectric layer 601 and on a top surface of the uppermost second dielectric layer 601. Before the formation of the second redistribution pads 650, second seed pads 655 may be formed. The second redistribution pads 650 may be formed by an electroplating process. In an electroplating process, the second seed pads 655 are used as electrodes (i.e., seed layers) on which the second redistribution pads grow to form a second redistribution substrate 600. The second redistribution substrate 600 may include the second dielectric layers 601, the second seed patterns 635, the second redistribution patterns 630, the second seed pads 655, and the second redistribution pads 650.

Figure 4R:
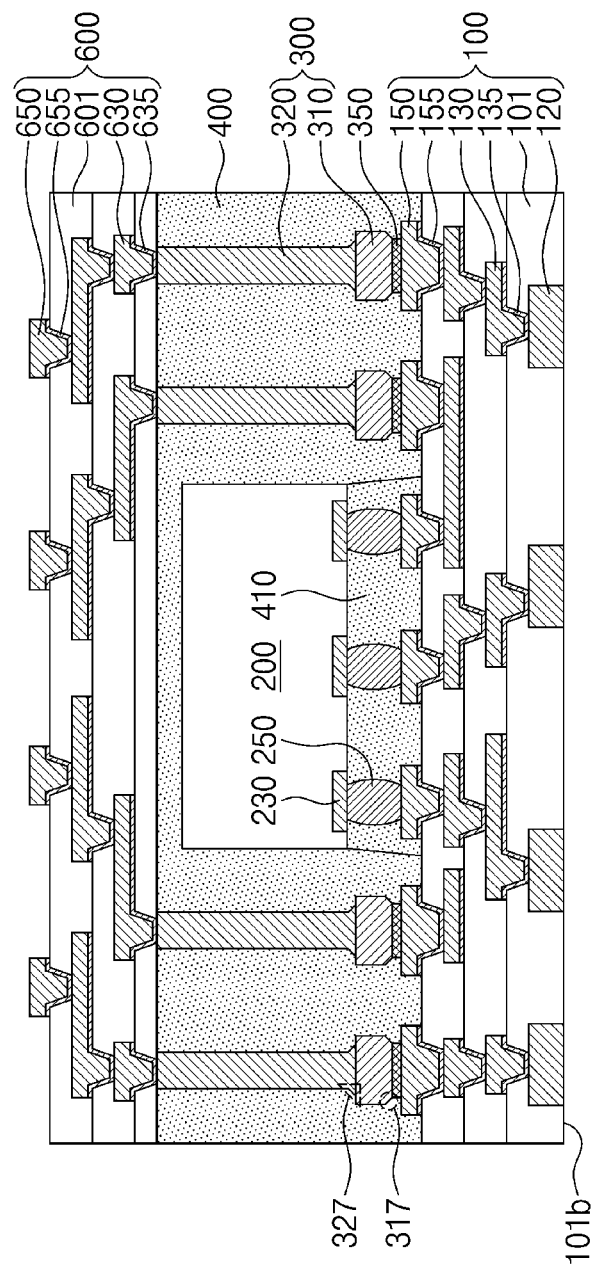

Referring to FIG. 4R, the carrier substrate 900 may be removed to expose a bottom surface of the first redistribution substrate 100. For example, there may be exposed a bottom surface 101b of a lowermost first dielectric layer 101 and bottom surfaces of the under-bump patterns 120.

Referring to FIG. 1A, solder balls 500 may be formed on bottom surfaces of the under-bump patterns 120, respectively. The solder balls 500 may be coupled to the under-bump patterns 120. Through the processes as discussed above, a semiconductor package 10 may be fabricated.

According to the present inventive concepts, each of conductive structures may include a first conductive structure and a second conductive structure that are stacked on each other. Therefore, it may be possible to reduce limitations on height and aspect ratio of the conductive structures and to secure a process margin for an interval between a first redistribution substrate and a second redistribution substrate. A relatively thick semiconductor chip may be mounted on the first redistribution substrate. A semiconductor package may exhibit increased thermal properties and improved mechanical characteristics.

The first conductive structure and the second conductive structure may include a first resist pattern and a second resist pattern, respectively. The second resist pattern may be removed by a lift-off process used for removing the first resist pattern. As a result, it may be possible to increase efficiency of semiconductor package fabrication process.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
a first redistribution substrate;
a semiconductor chip on a top surface of the first redistribution substrate;
a conductive structure provided on the top surface of the first redistribution substrate and laterally spaced apart from the semiconductor chip;
a molding layer on the first redistribution substrate, the molding layer covering a sidewall of the semiconductor chip and a sidewall of the conductive structure, wherein the conductive structure includes: a first conductive structure having a first sidewall; and a second conductive structure on a top surface of the first conductive structure, the second conductive structure having a second sidewall, wherein the first conductive structure has an undercut at a lower portion of the first sidewall, and wherein the second conductive structure has a protrusion at a lower portion of the second sidewall;
a redistribution pad including a lower portion buried in the first redistribution substrate and an upper portion disposed on the top surface of the first redistribution substrate; and
a conductive pattern between the redistribution pad and the first conductive structure, wherein a width of the conductive pattern is less than a width at the top surface of the first conductive structure and is equal to a width at a bottom surface of the first conductive structure,
wherein a maximum width of the conductive pattern is smaller than a maximum width of the first conductive structure.

2. The semiconductor package of claim 1,
wherein a first height of the first conductive structure is less than a second height of the second conductive structure.

3. The semiconductor package of claim 1,
wherein a width at a top surface of the second conductive structure is less than the width at the top surface of the first conductive structure.

4. The semiconductor package of claim 3,
wherein the width at the bottom surface of the first conductive structure is less than the width at the top surface of the first conductive structure,
wherein a width at a bottom surface of the second conductive structure is greater than the width at the top surface of the second conductive structure, and
wherein the width at the bottom surface of the second conductive structure is less than the width at the top surface of the first conductive structure.

5. The semiconductor package of claim 3,
wherein a difference between the width at the top surface of the first conductive structure and the width at the top surface of the second conductive structure is a value between about 20 μm and about 30 μm.

6. The semiconductor package of claim 1,
wherein the molding layer covers the protrusion and fills a region defined by the undercut.

7. The semiconductor package of claim 1,
wherein the second conductive structure exposes an edge region at the top surface of the first conductive structure, and
wherein the molding layer covers the edge region at the top surface of the first conductive structure.

8. The semiconductor package of claim 1,
wherein the second conductive structure contacts the first conductive structure, and
wherein the second conductive structure includes a material that is the same as a material of the first conductive structure and has a grain different from a grain of the first conductive structure.

9. The semiconductor package of claim 1,
wherein the undercut is recessed from the first sidewall of the first conductive structure, and
wherein the protrusion protrudes from the second sidewall of the second conductive structure.

10. The semiconductor package of claim 1, further comprising:
a second redistribution substrate on the molding layer and the second conductive structure,
wherein the second redistribution substrate is coupled to the second conductive structure.

11. A semiconductor package, comprising:
a first redistribution substrate;
a semiconductor chip on a top surface of the first redistribution substrate;
a conductive structure provided on the top surface of the first redistribution substrate and laterally spaced apart from the semiconductor chip;
a second redistribution substrate provided on the semiconductor chip and the conductive structure and coupled to the conductive structure, wherein the conductive structure includes: a first conductive structure having a first sidewall and an undercut at a lower portion of the first sidewall; and a second conductive structure on the first conductive structure, and wherein a first height of the first conductive structure is less than a second height of the second conductive structure;
a redistribution pad including a lower portion buried in the first redistribution substrate and an upper portion disposed on the top surface of the first redistribution substrate; and
a conductive pattern between the redistribution pad and the first conductive structure, wherein a width of the conductive pattern is less than a width at the top surface of the first conductive structure and is equal to a width at a bottom surface of the first conductive structure,
wherein a maximum width of the conductive pattern is smaller than a maximum width of the first conductive structure.

12. The semiconductor package of claim 11,
wherein the second conductive structure has a second sidewall and a protrusion at a lower portion of the second sidewall.

13. The semiconductor package of claim 11,
wherein the first height is between about 5% and about 45% of a sum of the first height and the second height.

14. The semiconductor package of claim 11,
wherein the first height is between about 30 μm and about 50 μm, and
wherein a sum of the first height and the second height is between about 150 μm and about 250 μm.

15. The semiconductor package of claim 11, further comprising:
a molding layer between the first redistribution substrate and the second redistribution substrate,
wherein the molding layer fills a region defined the undercut and covers the semiconductor chip and the first sidewall of the first conductive structure.

16. The semiconductor package of claim 11, further comprising:
an upper semiconductor chip on a top surface of the second redistribution substrate.

17. A semiconductor package, comprising:
a first redistribution substrate that includes a first dielectric layer, a first conductive pattern, and a first redistribution pattern on the first conductive pattern;
a solder ball on a bottom surface of the first redistribution substrate;
a semiconductor chip on a top surface of the first redistribution substrate;
a conductive structure provided on the first redistribution substrate and laterally spaced apart from the semiconductor chip;
a redistribution pad including a lower portion buried in the first redistribution substrate and an upper portion disposed on the top surface of the first redistribution substrate;
a second conductive pattern between the redistribution pad and the conductive structure, wherein a width of the second conductive pattern is less than a width at the top surface of the conductive structure;
a molding layer provided on the first redistribution substrate and covering the semiconductor chip, the molding layer covering a sidewall of the conductive structure and exposing a top surface of the conductive structure; and
a second redistribution substrate provided on the molding layer and electrically connected to the conductive structure,
wherein the second redistribution substrate includes a second dielectric layer, a third conductive pattern, and a second redistribution pattern on the third conductive pattern,
wherein the first dielectric layer includes a photo-imageable polymer,
wherein the second dielectric layer includes a photo-imageable polymer,
wherein the conductive structure includes a signal conductive structure and a ground/power structure that are electrically separated from each other,
wherein each of the signal conductive structure and the ground/power structure includes:
a first conductive structure that has a first sidewall and an undercut at a lower portion of the first sidewall; and
a second conductive structure on a top surface of the first conductive structure, and
wherein the second conductive structure has a second sidewall and a protrusion at a lower portion of the second sidewall.

18. The semiconductor package of claim 17,
wherein the first conductive structure has a first height,
wherein the second conductive structure has a second height, and
wherein the first height is between about 5% and about 45% of a sum of the first height and the second height.

19. The semiconductor package of claim 17,
wherein a width at a bottom surface of the first conductive structure is less than a width at the top surface of the first conductive structure,
wherein a width at a bottom surface of the second conductive structure is greater than a width at a top surface of the second conductive structure, and
wherein the width at the bottom surface of the second conductive structure is less than the width at the top surface of the first conductive structure.

* * * * *